(12) United States Patent
Xu et al.

(10) Patent No.: US 6,777,171 B2
(45) Date of Patent: Aug. 17, 2004

(54) FLUORINE-CONTAINING LAYERS FOR DAMASCENE STRUCTURES

(75) Inventors: Ping Xu, Fremont, CA (US); Jia Lee, Ossining, NY (US); Ishing Lou, Santa Clara, CA (US); Li-Qun Xia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

(21) Appl. No.: 09/839,869

(22) Filed: Apr. 20, 2001

(65) Prior Publication Data

US 2002/0155386 A1 Oct. 24, 2002

(51) Int. Cl.[7] .................. H01L 21/31; H01L 21/283; C23C 16/00
(52) U.S. Cl. .................. 430/322; 430/311; 430/313; 430/317
(58) Field of Search .................. 430/311, 313, 430/317; 438/758, 774, 778, 786, 931; 427/249.15

(56) References Cited

U.S. PATENT DOCUMENTS

| | | | |
|---|---|---|---|
| 4,262,631 A | | 4/1981 | Kubacki .................. 118/723 |
| 4,532,150 A | | 7/1985 | Endo et al. .................. 427/39 |
| 4,634,601 A | | 1/1987 | Hamakawa et al. .......... 427/39 |
| 4,759,947 A | | 7/1988 | Ishihara et al. .................. 427/38 |
| 4,894,352 A | | 1/1990 | Lane et al. .................. 437/238 |
| 5,238,866 A | | 8/1993 | Bolz et al. .................. 437/100 |
| 5,296,258 A | * | 3/1994 | Tay et al. .................. 427/249.15 |
| 5,419,783 A | * | 5/1995 | Noguchi et al. .................. 438/96 |
| 5,441,914 A | * | 8/1995 | Taft et al. .................. 148/DIG. 1 |
| 5,465,680 A | | 11/1995 | Loboda .................. 117/84 |
| 5,591,566 A | | 1/1997 | Ogawa .................. 430/325 |
| 5,880,018 A | * | 3/1999 | Boeck et al. .................. 438/619 |
| 5,948,928 A | | 9/1999 | Siegele et al. .................. 556/442 |
| 5,989,998 A | | 11/1999 | Sugahara et al. .................. 438/623 |
| 6,020,458 A | | 2/2000 | Lee et al. .................. 528/401 |
| 6,051,321 A | | 4/2000 | Lee et al. .................. 428/447 |
| 6,054,379 A | | 4/2000 | Yau et al. .................. 438/623 |
| 6,060,132 A | | 5/2000 | Lee .................. 427/579 |
| 6,068,884 A | | 5/2000 | Rose et al. .................. 427/255.6 |
| 6,107,184 A | | 8/2000 | Mandal et al. .................. 438/623 |
| 6,140,226 A | | 10/2000 | Grill et al. .................. 438/637 |
| 6,147,009 A | | 11/2000 | Grill et al. .................. 438/780 |

(List continued on next page.)

FOREIGN PATENT DOCUMENTS

| | | | |
|---|---|---|---|
| EP | 0 826 791 A2 | 3/1998 | .......... C23C/16/40 |
| WO | 99/21706 | 5/1999 | .......... B32B/09/04 |

OTHER PUBLICATIONS

Nara, et al., "Low Dielectric Constant Insulator Formed by Downstream Plasma CVD at Room Temperature Using TMS/O2", Japanese Journal of Applied Physics, vol. 36. No. 3B (Mar. 1997), pp. 1477–1480.

*Primary Examiner*—Mark F. Huff
*Assistant Examiner*—K Sagar
(74) *Attorney, Agent, or Firm*—Moser, Patterson & Sheridan

(57) ABSTRACT

A method of forming a silicon carbide layer, a silicon nitride layer, an organosilicate layer is disclosed. The silicon carbide layer is formed by reacting a gas mixture comprising a silicon source, a carbon source, and a fluorine source in the presence of an electric field. The silicon nitride layer is formed by reacting a gas mixture comprising a silicon source, a nitrogen source, and a fluorine source in the presence of an electric field. The organosilicate layer is formed by reacting a gas mixture comprising a silicon source, a carbon source, an oxygen source and a fluorine source in the presence of an electric field. The silicon carbide layer, the silicon nitride layer and the organosilicate layer are all compatible with integrated circuit fabrication processes.

67 Claims, 12 Drawing Sheets

U.S. PATENT DOCUMENTS

| | | | |
|---|---|---|---|
| 6,171,945 B1 | 1/2001 | Mandal et al. | 438/780 |
| 6,184,128 B1 * | 2/2001 | Wang et al. | 438/782 |
| 6,211,040 B1 | 4/2001 | Liu et al. | 438/424 |
| 6,245,690 B1 | 6/2001 | Yau et al. | 438/780 |
| 6,258,735 B1 | 7/2001 | Xia et al. | 438/788 |
| 6,287,990 B1 | 9/2001 | Cheung et al. | 438/780 |
| 6,303,523 B2 | 10/2001 | Cheung et al. | 438/780 |
| 6,312,793 B1 | 11/2001 | Grill et al. | 428/312.6 |
| 6,348,725 B2 | 2/2002 | Cheung et al. | 257/642 |
| 6,365,527 B1 * | 4/2002 | Yang et al. | 438/761 |
| 6,437,443 B1 | 8/2002 | Grill et al. | 257/758 |
| 6,441,491 B1 | 8/2002 | Grill et al. | 257/759 |
| 6,479,110 B2 | 11/2002 | Grill et al. | 427/577 |
| 6,488,176 B2 | 12/2002 | Garrant et al. | 221/79 |
| 6,497,963 B1 | 12/2002 | Grill et al. | 428/446 |
| 6,521,546 B1 * | 2/2003 | Barnes et al. | 438/778 |
| 6,558,756 B2 | 5/2003 | Sugahara et al. | 427/490 |
| 2001/0004479 A1 | 6/2001 | Cheung et al. | 427/553 |
| 2001/0005546 A1 | 6/2001 | Cheung et al. | 428/210 |
| 2002/0045361 A1 | 4/2002 | Cheung et al. | 438/790 |
| 2002/0098714 A1 | 7/2002 | Grill et al. | 438/778 |
| 2003/0049460 A1 | 3/2003 | O'Neill et al. | 428/426 |
| 2003/0064154 A1 | 4/2003 | Laxman et al. | 427/255.28 |

* cited by examiner

FLUORINE-CONTAINING LAYERS FOR DAMASCENE STRUCTURES

BACKGROUND OF THE DISCLOSURE

1. Field of the Invention

The present invention relates to silicon carbide layers, silicon nitride layers, and organosilicate layers and, more particularly to methods of forming silicon carbide layers, silicon nitride layers and organosilicate layers.

2. Background of the Invention

Integrated circuits have evolved into complex devices that can include millions of components (e.g., transistors, capacitors and resistors) on a single chip. The evolution of chip designs continually requires faster circuitry and greater circuit densities. The demands for greater circuit densities necessitates a reduction in the dimensions of the integrated circuit components.

As the dimensions of the integrated circuit components are reduced (e.g., sub-micron dimensions), the materials used to fabricate such components contribute to the electrical performance of such components. For example, low resistivity metal interconnects (e.g., aluminum and copper) provide conductive paths between the components on integrated circuits.

Typically, the metal interconnects are electrically isolated from each other by a bulk insulating material. When the distance between adjacent metal interconnects and/or the thickness of the bulk insulating material has sub-micron dimensions, capacitive coupling potentially occurs between such interconnects. Capacitive coupling between adjacent metal interconnects may cause cross-talk and/or resistance-capacitance (RC) delay, which degrades the overall performance of the integrated circuit.

In order to minimize capacitive coupling between adjacent metal interconnects, low dielectric constant bulk insulating materials (e.g., dielectric constants less than about 3.5) are needed. Typically, bulk insulating materials with dielectric constants less than about 3.5 are tensile materials (e.g., tensile stresses greater than about $10^8$ dynes/cm$^2$). Examples of low dielectric constant bulk insulating materials include silicon dioxide ($SiO_2$), silicate glass, and organosilicates, among others.

In addition, a low dielectric constant (low k) barrier layer often separates the metal interconnects from the bulk insulating materials. The barrier layer minimizes the diffusion of the metal from the interconnects into the bulk insulating material. Diffusion of the metal from the interconnects into the bulk insulating material is undesirable because such diffusion can affect the electrical performance of the integrated circuit (e.g., cross-talk and/or RC delay), or render it inoperative.

The demands for greater integrated circuit densities also impose demands on the process sequences used for integrated circuit manufacture. For example, in process sequences using conventional lithographic techniques, a layer of energy sensitive resist is formed over a stack of material layers on a substrate. Many of these underlying material layers are reflective to ultraviolet light. Such reflections can distort the dimensions of features such as lines and vias that are formed in the energy sensitive resist material.

One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist.

Silicon carbide (SiC) has been suggested for use as a barrier layer and/or ARC on integrated circuits, since silicon carbide layers can have a low dielectric constant (dielectric constant less than about 5.5), are good metal diffusion barriers and can have good light absorption properties. Silicon nitride has also been suggested as a barrier layer and/or ARC, since it also has good metal diffusion barrier and can have good light absorption properties.

Thus, there is an ongoing need for silicon carbide layers, silicon nitride layers, and organosilicate layers with low dielectric constants as well as improved film characteristics.

SUMMARY OF THE INVENTION

A method of forming a silicon carbide layer for use in integrated circuit fabrication processes is provided. The silicon carbide layer is formed by reacting a gas mixture comprising a silicon source, a carbon source, and a fluorine source in the presence of an electric field.

A method of forming a silicon nitride layer for use in integrated circuit fabrication processes is provided. The silicon nitride layer is formed by reacting a gas mixture comprising a silicon source, a nitrogen source, and a fluorine source in the presence of an electric field.

A method of forming an organosilicate layer for use in integrated circuit fabrication processes is provided. The organosilicate layer is formed by reacting a gas mixture comprising a silicon source, a carbon source, an oxygen source and a fluorine source in the presence of an electric field.

The silicon carbide layer, the silicon nitride layer and the organosilicate layer are all compatible with integrated circuit fabrication processes. In one integrated circuit fabrication process, the silicon carbide layer is used as both a hard mask and a barrier layer for fabricating integrated circuit structures such as, for example, a dual damascene structure. For such an embodiment, a preferred process sequence includes depositing a silicon carbide barrier layer on a metal layer formed on a substrate. After the silicon carbide barrier layer is deposited on the substrate a first dielectric layer is formed thereon. A silicon carbide hard mask layer is formed on the first dielectric layer. The silicon carbide hard mask is patterned to define vias therein. Thereafter, a second dielectric layer is formed on the patterned silicon carbide hard mask layer. The second dielectric layer is patterned to define interconnects therein. The interconnects formed in the second dielectric layer are positioned over the vias defined in the silicon carbide hard mask layer. After the second dielectric layer is patterned, the vias defined in the silicon carbide hard mask layer are transferred into the first dielectric layer. Thereafter, the dual damascene structure is completed by filling the vias and interconnects with a conductive material.

Alternatively, a silicon nitride layer may be used as both a hard mask and a barrier layer for fabricating the dual damascene structure. For such an embodiment, a preferred process sequence includes depositing a silicon nitride barrier layer on a metal layer formed on a substrate. After the silicon nitride barrier layer is deposited on the substrate a first dielectric layer is formed thereon. A silicon nitride hard mask layer is formed on the first dielectric layer. The silicon nitride hard mask is patterned to define vias therein. Thereafter, a second dielectric layer is formed on the patterned silicon nitride hard mask layer. The second dielectric layer is patterned to define interconnects therein. The interconnects formed in the second dielectric layer are positioned over the vias defined in the silicon nitride hard mask layer. After the second dielectric layer is patterned, the vias defined in the silicon nitride hard mask layer are transferred into the first dielectric layer. Thereafter, the dual damascene structure is completed by filling the vias and interconnects with a conductive material.

In another integrated circuit fabrication process, an organosilicate material may be used as the first and second dielectric layers in the dual damascene structure. For such an embodiment, a preferred process sequence includes depositing a barrier layer on a metal layer formed on a substrate. After the barrier layer is deposited on the substrate a first organosilicate layer is formed thereon. A hard mask layer is formed on the first organosilicate layer. The hard mask is patterned to define vias therein. Thereafter, a second organosilicate layer is formed on the patterned hard mask layer. The second organosilicate layer is patterned to define interconnects therein. The interconnects formed in the second organosilicate layer are positioned over the vias defined in the hard mask layer. After the second organosilicate layer is patterned, the vias defined in the hard mask layer are transferred into the first organosilicate layer. Thereafter, the dual damascene structure is completed by filling the vias and interconnects with a conductive material.

The silicon carbide layer, the silicon nitride layer, or the organosilicate may also function as an anti-reflective coating (ARC) for deep ultraviolet (DUV) lithography. For such an embodiment, a preferred process sequence includes forming a silicon carbide layer (alternatively a silicon nitride layer or an organosilicate layer) on a substrate. The silicon carbide layer (alternatively the silicon nitride layer or the organosilicate layer) has a refractive index (n) in a range of about 1.6 to about 2.2 and an absorption coefficient ($\kappa$) in a range of about 0.1 to about 0.9 at wavelengths less than about 250 nm (nanometers). The refractive index (n) and the absorption coefficient ($\kappa$) are tunable, in that they can be varied in the desired range as a function of the composition of the gas mixture during silicon carbide layer formation. After the silicon carbide layer (alternatively the silicon nitride layer or the organosilicate layer) is formed on the substrate, a layer of energy sensitive resist material is formed thereon. A pattern is defined in the energy sensitive resist at a wavelength less than about 250 nm. Thereafter, the pattern defined in the energy sensitive resist material is transferred into the silicon carbide layer (alternatively the silicon nitride layer or the organosilicate layer) and, optionally, into the substrate.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
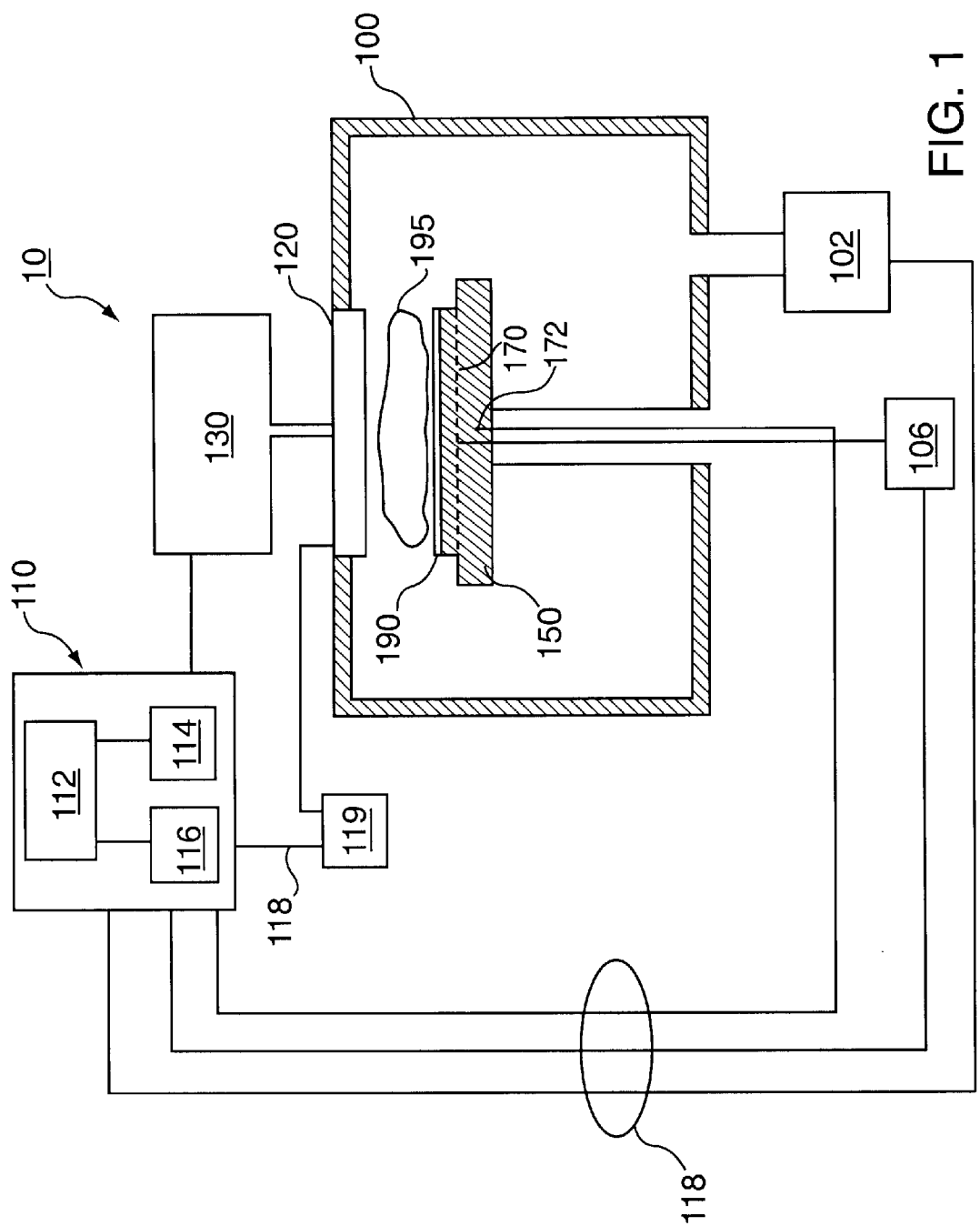
FIG. 1 depicts a schematic illustration of an apparatus that can be used for the practice of embodiments described herein.

FIG. 1 is a schematic representation of a wafer processing system 10 that can be used to perform silicon carbide layer, silicon nitride layer, and organosilicate layer deposition in accordance with embodiments described herein. System 10 typically comprises a process chamber 100, a gas panel 130, a control unit 110, along with other hardware components such as power supplies 119, 106 and vacuum pumps 102. Examples of wafer processing system 10 include plasma enhanced chemical vapor deposition (PECVD) chambers such as DXZ™ chambers, commercially available from Applied Materials Inc., located in Santa Clara, Calif.

Details of wafer processing system 10 are described in commonly assigned U.S. patent application Ser. No. 09/211, 998, entitled "High Temperature Chemical Vapor Deposition Chamber", filed on Dec. 14, 1998, and is herein incorporated by reference. The salient features of this system 10 are briefly described below.

The process chamber 100 generally houses a support pedestal 150, which is used to support a substrate such as a semiconductor wafer 190. This pedestal 150 can typically be moved in a vertical direction inside the chamber 100 using a displacement mechanism (not shown).

Depending on the specific process, the wafer 190 can be heated to some desired temperature prior to layer deposition. For example, referring to FIG. 1, the wafer support pedestal 150 is heated by an embedded heater element 170. The pedestal 150 may be resistively heated by applying an electric current from an AC power supply 106 to the heater element 170. The wafer 190 is, in turn, heated by the pedestal 190.

A temperature sensor 172, such as a thermocouple, may also be embedded in the wafer support pedestal 150 to monitor the temperature of the pedestal in a conventional manner. The measured temperature can be used in a feedback loop to control the power supplied to the heater element 170, such that the wafer temperature can be maintained or controlled at a desired temperature which is suitable for the particular process application. The pedestal may optionally be heated using radiant heat (not shown).

A vacuum pump 102, is used to evacuate the process chamber 100 and to maintain the proper gas flows and pressure inside the chamber 100. A showerhead 120, through which process gases are introduced into the chamber 100, is located above the wafer support pedestal 150. The showerhead 120 is connected to a gas panel 130, which controls and supplies various gases used in different steps of the process sequence.

The showerhead 120 and wafer support pedestal 150 also form a pair of spaced apart electrodes. When an electric field is generated between these electrodes, the process gases introduced into the chamber 100 are ignited into a plasma. The electric field is generated by connecting the showerhead 120 to a source of radio frequency (RF) power (not shown) through a matching network (not shown). Alternatively, the RF power source and the matching network may be coupled to both the showerhead 120 and the wafer support pedestal 150.

The electric filed may optionally be generated by coupling the showerhead 120 to a source of mixed radio frequency (RF) power 119. Details of the mixed RF power source 119 are described in commonly assigned U.S. Pat. No. 6,041,734, entitled, "Use of an Asymmetric Waveform to Control Ion Bombardment During Substrate Processing", issued Mar. 28, 2000, and is herein incorporated by reference.

Typically, the source of mixed RF power 119 under the control of a controller unit 110 provides a high frequency power (e.g., RF power in a range of about 10 MHz to about 15 MHz) as well as a low frequency power (e.g., RF power in a range of about 150 KHz to about 450 KHz) to the showerhead 120. Both the high frequency RF power and the low frequency RF power may be coupled to the showerhead 120 through a matching network (not shown). The high frequency RF power source and the low frequency RF power source may optionally be coupled to the wafer support pedestal 150, or alternatively one may be coupled to the showerhead 120 and the other may be coupled to the wafer support pedestal 150.

Plasma enhanced chemical vapor deposition (PECVD) techniques promote excitation and/or disassociation of the reactant gases by the application of the electric field to a reaction zone 195 near the substrate surface, creating a plasma of reactive species. The reactivity of the species in the plasma reduces the energy required for a chemical reaction to take place, in effect lowering the required temperature for such PECVD processes.

Proper control and regulation of the gas flows through the gas panel 130 is performed by mass flow controllers (not shown) and the controller unit 110. The showerhead 120 allows process gases from the gas panel 130 to be uniformly introduced and distributed in the process chamber 100.

Illustratively, the control unit 110 comprises a central processing unit (CPU) 113, as well as support circuitry 114, and memories containing associated control software 116. The control unit 110 is responsible for automated control of the numerous steps required for wafer processing—such as wafer transport, gas flow control, mixed RF power control, temperature control, chamber evacuation, and other steps. Bi-directional communications between the control unit 110 and the various components of the wafer processing system 10 are handled through numerous signal cables collectively referred to as signal buses 118, some of which are illustrated in FIG. 1.

The central processing unit (CPU) 113 may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines are executed after the substrate 190 is positioned on the wafer support pedestal 150. The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software and hardware.

Silicon Carbide Layer Formation

A silicon carbide layer is formed by reacting a gas mixture including a silicon source, a carbon source, and a fluorine source. The silicon source may be an organosilane compound. Suitable organosilane compounds may have the general formula $Si_xC_yH_z$, where x has a range from 1 to 2, y has a range from 1 to 6, and z has a range from 4 to 18. For example, methylsilane ($SiCH_6$), dimethylsilane ($SiC_2H_8$), trimethylsilane ($SiC_3H_{10}$), tetramethylsilane ($SiC_4H_{12}$), and diethylsilane ($SiC_4H_{12}$), among others may be used as the organosilane compound. Alternatively, silane ($SiH_4$), disilane ($Si_2H_6$), methane ($CH_4$), and combinations thereof, may be used as the silicon source and the carbon source.

Carbon tetrafluoride ($CF_4$), fluoroethane ($C_2F_6$), trifluoromethane ($CHF_3$), difluoromethane ($CH_2F_2$), and nitrogen fluoride ($NF_3$), or combinations thereof, among others may be used for the fluorine source.

The gas mixture may further comprise an inert gas. Helium (He), argon (Ar), neon (Ne), or combination thereof, among others, may be used for the inert gas.

In general, the following deposition process parameters can be used to form the silicon carbide layer in a process chamber similar to that shown in FIG. 1. The process parameters range from a wafer temperature of about 150° C. to about 450° C., a chamber pressure of about 1 torr to about 15 torr, a silicon source and/or carbon source flow rate of about 10 sccm to about 2000 sccm, a fluorine source flow rate of about 50 sccm to about 10,000 sccm, an inert gas flow rate of less than about 1000 sccm, a plate spacing of about 300 mils to about 600 mils, and an RF power of about 1 watt/cm$^2$ to about 10 watts/cm$^2$ (for either of the single or mixed frequency RF powers). Additionally, the ratio of the silicon source to the fluorine source in the gas mixture should have a range of about 1:1 to about 1:100. The above process parameters provide a deposition rate for the silicon carbide layer in a range of about 100 Å/min to about 3000 Å/min when implemented on a 200 mm (millimeter) substrate in a deposition chamber available from Applied Materials, Inc., located in Santa Clara, Calif.

Other deposition chambers are within the scope of the invention, and the parameters listed above may vary according to the particular deposition chamber used to form the silicon carbide layer. For example, other deposition chambers may have a larger (e.g., configured to accommodate 300 mm substrates) or smaller volume, requiring gas flow rates that are larger or smaller than those recited for deposition chambers available from Applied Materials Inc., Santa Clara, Calif.

Some fluorine from the fluorine source may be incorporated into the silicon carbide layer during layer formation. Such incorporation is believed to reduce the dielectric constant thereof, such that is less than about 5.5, making it suitable for use as a barrier material in integrated circuits. The dielectric constant of the silicon carbide layer may be varied as a function of the composition of the gas mixture during layer formation. As the fluorine (F) and/or carbon (C) concentration in the gas mixture increases, the F and/or C content of the silicon carbide layer increases, decreasing its dielectric constant. In addition, as the F content of the silicon carbide layer increases the etch rate thereof similarly increases. Also, as the C content of the silicon carbide layer increases the hydrophobic properties thereof increase, making such layer suitable for use as moisture barriers in integrated circuits.

The dielectric constant of the silicon carbide layer may also be varied as a function of the RF power. In particular, as the RF power is increased the dielectric constant of the as-deposited silicon carbide layer also increases.

The silicon carbide layer also has a light absorption coefficient ($\kappa$) that can be varied between about 0.1 to about 0.9 at wavelengths below 250 nm (nanometers), making it suitable for use as an anti-reflective coating (ARC) at DUV wavelengths. The absorption coefficient ($\kappa$) of the silicon carbide layer may be varied as a function of the composition of the gas mixture. In particular, as the concentration of the carbon source is increased, the absorption coefficient ($\kappa$) of the as-deposited silicon carbide layer likewise increases.

After the silicon carbide layer is formed, it may be plasma treated with an inert gas. Helium (He), argon (Ar), neon (Ne), and combinations thereof, may be used for the inert gas. Such plasma treatment is believed to stabilize the layer, such that it becomes less reactive with moisture and/or oxygen under atmospheric condition as well as to improve the adhesion of layers formed thereover.

In general, the following process parameters can be used to plasma treat the silicon carbide layer in a process chamber similar to that shown in FIG. 1. The process parameters range from a chamber pressure of about 5 torr to about 10 torr, an inert gas flow rate of about 1000 sccm to about 7000 sccm, and a radio frequency (RF) power of about 1 watt/cm$^2$ to about 10 watts/cm$^2$. The silicon carbide layer is plasma treated for less than about 1000 seconds.

Silicon Nitride Layer Formation

A silicon nitride layer is formed by reacting a gas mixture including a silicon source, a nitrogen source, and a fluorine source. The silicon source may be silane (SiH$_4$) and disilane (Si$_2$H$_6$), trisilane (Si$_3$H$_8$), tetrasilane (Si$_4$H$_{10}$), and combinations thereof, among others. Ammonia (NH$_3$), nitrogen (N$_2$), and combinations thereof, among others may be used as the nitrogen source.

Carbon tetrafluoride (CF$_4$), fluoroethane (C$_2$F$_6$), trifluoromethane (CHF$_3$), difluoromethane (CH$_2$F$_2$), and nitrogen fluoride (NF$_3$), or combinations thereof, among others may be used for the fluorine source.

The gas mixture may further comprise an inert gas. Helium (He), argon (Ar), neon (Ne), or combination thereof, among others, may be used for the inert gas.

In general, the following deposition process parameters can be used to form the silicon nitride layer in a process chamber similar to that shown in FIG. 1. The process parameters range from a wafer temperature of about 200° C. to about 600° C., a chamber pressure of about 1 torr to about 20 torr, a silicon source flow rate of about 50 sccm to about 500 sccm, a nitrogen source flow rate of about 10 sccm to about 300 sccm, a fluorine source flow rate of about 1 sccm to about 10,000 sccm, an inert gas flow rate of less than about 10000 sccm, a plate spacing of about 300 mils to about 600 mils, and an RF power of about 1 watt/cm$^2$ to about 10 watts/cm$^2$ (for either of the single or mixed frequency RF powers). Additionally, the ratio of the silicon source to the fluorine source in the gas mixture should have a range of about 1:1 to about 1:100. The above process parameters provide a deposition rate for the silicon nitride layer in a range of about 100 Å/min to about 10000 Å/min when implemented on a 200 mm (millimeter) substrate in a deposition chamber available from Applied Materials, Inc., located in Santa Clara, Calif.

Other deposition chambers are within the scope of the invention, and the parameters listed above may vary according to the particular deposition chamber used to form the silicon nitride layer. For example, other deposition chambers may have a larger (e.g., configured to accommodate 300 mm substrates) or smaller volume, requiring gas flow rates that are larger or smaller than those recited for deposition chambers available from Applied Materials Inc., Santa Clara, Calif.

Some fluorine from the fluorine source may be incorporated into the silicon nitride layer during layer formation. Such incorporation is believed to reduce the dielectric constant thereof, such that is less than about 7, making it suitable for use as a barrier material in integrated circuits.

The dielectric constant of the silicon nitride layer may be varied as a function of the composition of the gas mixture during layer formation. As the fluorine (F) and/or silicon (Si) concentration in the gas mixture increases, the F and/or Si content of the silicon nitride layer increases, decreasing its dielectric constant. In addition, as the F content of the silicon nitride layer increases the etch rate thereof similarly increases. Also, as the nitrogen (N) content of the silicon nitride layer increases the hydrophobic properties thereof increase, making such layer suitable for use as moisture barriers in integrated circuits.

The dielectric constant of the silicon nitride layer may also be varied as a function of the RF power. In particular, as the RF power is increased the dielectric constant of the as-deposited silicon nitride layer also increases.

The silicon nitride layer also has a light absorption coefficient ($\kappa$) that can be varied between about 0.1 to about 0.9 at wavelengths below 250 nm (nanometers), making it suitable for use as an anti-reflective coating (ARC) at DUV wavelengths. The absorption coefficient ($\kappa$) of the silicon nitride layer may be varied as a function of the composition of the gas mixture. In particular, as the concentration of the silicon source is increased, the absorption coefficient ($\kappa$) of the as-deposited layer likewise increases.

After the silicon nitride layer is formed, it may be plasma treated with an inert gas. Helium (He), argon (Ar), neon (Ne), and combinations thereof, may be used for the inert gas. Such plasma treatment is believed to stabilize the layer, such that it becomes less reactive with moisture and/or oxygen under atmospheric condition as well as to improve the adhesion of layers formed thereover.

In general, the following process parameters can be used to plasma treat the silicon nitride layer in a process chamber similar to that shown in FIG. 1. The process parameters range from a chamber pressure of about 5 torr to about 10 torr, an inert gas flow rate of about 1000 sccm to about 7000 sccm, and a radio frequency (RF) power of about 1 watt/cm$^2$ to about 10 watts/cm$^2$. The silicon nitride layer is plasma treated for less than about 1000 seconds.

Organosilicate Layer Formation

An organosilicate layer is formed by reacting a gas mixture including a silicon source, a carbon source, an oxygen source, and a fluorine source. The silicon source may be an organosilane compound. Suitable organosilane compounds may have the general formula $Si_xC_yH_z$, where x has a range from 1 to 2, y has a range from 1 to 6, and z has a range from 4 to 18. For example, methylsilane ($SiCH_6$), dimethylsilane ($SiC_2H_8$), trimethylsilane ($SiC_3H_{10}$), tetramethylsilane ($SiC_4H_{12}$), bis(methylsilano)methane ($Si_2C_3H_{12}$), 1,2-bis(methylsilano)ethane ($Si_2C_4H_{14}$), and diethylsilane ($SiC_4H_{12}$), among others may be used as the organosilane compound. Silane ($SiH_4$), disilane ($Si_2H_6$), methane ($CH_4$), and combinations thereof, may also be used as the silicon source and the carbon source.

Alternatively, the organosilane compound may have the general formula $Si_aC_bH_cO_d$, where a has a range from 1 to 2, b has a range from 1 to 10, c has a range from 6 to 30, and d has a range from 1 to 6. For example, methoxysilane ($SiCH_6O$), dimethyldimethoxysilane ($SiC_4H_{12}O_2$), diethyldiethoxysilane ($SiC_8H_{20}O_2$), dimethyldiethoxysilane ($SiC_6H_{16}O_2$), diethyldimethoxysilane ($SiC_6H_{16}O_2$), and hexamethyldisiloxane ($Si_2C_6H_{18}O$), among others are also suitable organosilane compounds.

Oxygen ($O_2$), ozone ($O_3$), nitrous oxide ($N_2O$), carbon monoxide (CO), carbon dioxide ($CO_2$), or combinations thereof, among others, may be used for the carbon source.

Carbon tetrafluoride ($CF_4$), fluoroethane ($C_2F_6$), trifluoromethane ($CHF_3$), difluoromethane ($CH_2F_2$), and nitrogen fluoride ($NF_3$), or combinations thereof, among others may be used for the fluorine source.

The gas mixture may optionally include an inert gas. Helium (He), argon (Ar), neon (Ne), and xenon (Xe), as well as combinations thereof, among others, may be used for the inert gas.

In general, the following deposition process parameters can be used to form the organosilicate layer in a process chamber similar to that shown in FIG. 1. The process parameters range from a wafer temperature of about 50° C. to about 500° C., a chamber pressure of about 1 torr to about 500 torr, a silicon source and/or carbon source flow rate of about 10 sccm to about 2,000 sccm, an oxygen source flow rate of about 10 sccm to about 200 sccm, a fluorine source flow rate of about 15 sccm to about 10,000 sccm, an inert gas flow rate of about 10 sccm to about 1,000 sccm, a plate spacing of about 300 mils to about 600 mils, and an RF power of about 1 watt/$cm^2$ to about 500 watts/$cm^2$ (for either of the single or mixed frequency RF powers). The above process parameters provide a deposition rate for the organosilicate layer in the range of about 0.1 microns/minute to about 2 microns/minute when implemented on a 200 mm (millimeter) substrate in a deposition chamber available from Applied Materials, Inc., Santa Clara, Calif.

Other deposition chambers are within the scope of the invention, and the parameters listed above may vary according to the particular deposition chamber used to form the organosilicate layer. For example, other deposition chambers may have a larger (e.g., configured to accommodate 300 mm substrates) or smaller volume, requiring gas flow rates that are larger or smaller than those recited for deposition chambers available from Applied Materials, Inc., Santa Clara, Calif.

Some fluorine from the fluorine source may be incorporated into the organosilicate layer during layer formation. Such incorporation is believed to reduce the dielectric constant thereof, such that is less than about 3.5, making it suitable for use as a dielectric material in integrated circuits. The dielectric constant of the organosilicate layer may be varied as a function of the composition of the gas mixture during layer formation. As the fluorine (F) and/or carbon (C) concentration in the gas mixture increases, the F and/or C content of the organosilicate layer increases, decreasing its dielectric constant. In addition, as the F content of the organosilicate layer increases the etch rate thereof similarly increases. Also, as the C content of the organosilicate layer increases the hydrophobic properties thereof increase, making such layer suitable for use as moisture barriers in integrated circuits.

The dielectric constant of the organosilicate layer may also be varied as a function of the RF power. In particular, as the RF power is increased the dielectric constant of the as-deposited organosilicate layer also increases.

The organosilicate layer also has a light absorption coefficient ($\kappa$) that can be varied between about 0.1 to about 0.9 at wavelengths below 250 nm (nanometers), making it suitable for use as an anti-reflective coating (ARC) at DUV wavelengths. The absorption coefficient ($\kappa$) of the organosilicate layer may be varied as a function of the composition of the gas mixture. In particular, as the concentration of the carbon source is increased, the absorption coefficient ($\kappa$) of the as-deposited layer likewise increases.

After the organosilicate layer is formed, it is treated with a plasma comprising an inert gas. For example, helium (He), argon (Ar), nitrogen ($N_2$), and combinations thereof, among others, may be used for the inert gas.

In general, the following process parameters may be used to plasma treat the organosilicate layer in a process chamber similar to that shown in FIG. 1. The process parameters range from a wafer temperature of about 50° C. to about 400° C., a chamber pressure of about 1 torr to about 10 torr, an inert gas flow rate of about 500 sccm to about 5,000 sccm, and a radio frequency (RF) power of about 1 watt/$cm^2$ to about 10 watts/$cm^2$. The organosilicate layer is plasma treated with the inert gas for less than about 1000 seconds.

The plasma treatment improves the adhesion of overlying material layers to the organosilicate layer. It is believed that the fracture strength of plasma treated organosilicate layers is greater than that of untreated organosilicate layers, minimizing cracking of the treated organosilicate layer so as to improve the adhesion of material layers thereto.

Integrated Circuit Fabrication Processes

Silicon Carbide Hard Mask

Figure 2A:
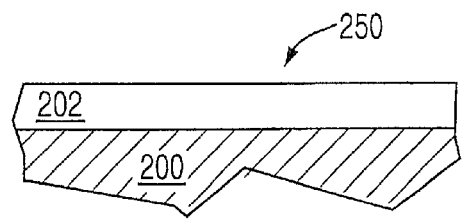
FIGS. 2a–2e illustrate schematic cross-sectional views of a substrate structure at different stages of integrated circuit fabrication incorporating a silicon carbide layer as a hard mask.

FIGS. 2a–2e illustrate schematic cross-sectional views of a substrate 200 at different stages of an integrated circuit fabrication sequence incorporating a silicon carbide layer as a hard mask. In general, the substrate 200 refers to any workpiece on which processing is performed, and a substrate structure 250 is used to generally denote the substrate together with other material layers formed on the substrate 200. Depending on the specific stage of processing, the substrate 200 may correspond to a silicon wafer, or other material layer that has been formed on the silicon wafer. FIG. 2a, for example, illustrates a cross-sectional view of a substrate structure 250, having a material layer 202 that has been conventionally formed thereon. The material layer 202 may be an oxide (e.g., silicon dioxide, fluorosilicate glass (FSG)). In general, the substrate 200 may include a layer of silicon, silicides, metals, or other materials. FIG. 2a illustrates one embodiment in which the substrate 200 is silicon having a silicon dioxide layer formed thereon.

Figure 2B:
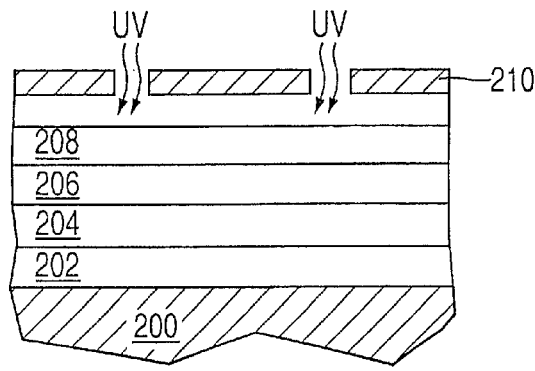

FIG. 2b depicts a silicon carbide layer 204 formed on the substrate structure 250 of FIG. 2a. The silicon carbide layer 204 is formed on the substrate structure 250 according to the process parameters described above. The thickness of the silicon carbide layer is variable depending on the specific stage of processing. Typically, the silicon carbide layer is deposited to a thickness of about 50 Å to about 1000 Å.

A layer of energy sensitive resist material 208 is formed on the silicon carbide layer 204. The layer of energy sensitive resist material 208 may be spin coated on the substrate to a thickness of within a range of about 4,000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 250 nm.

Dependent on the etch chemistry of the energy sensitive resist material used in the fabrication sequence, an intermediate layer 206 may be formed on the silicon carbide layer 204. When the energy sensitive resist material 208 and the silicon carbide layer 204 can be etched using the same chemical etchants or when resist poisoning may occur, the intermediate layer 206 functions as a mask for the silicon carbide layer 204. The intermediate layer 206 is conventionally formed on the silicon carbide layer 204. The intermediate layer 206 may be a silicon carbide cap layer, an oxide, amorphous silicon, or other suitable material layer.

Figure 2C:
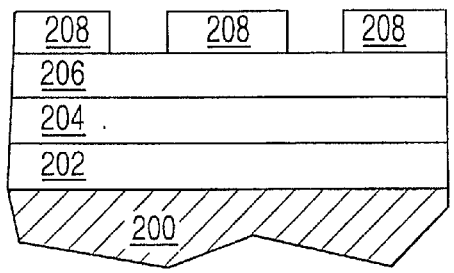
Figure 2D:
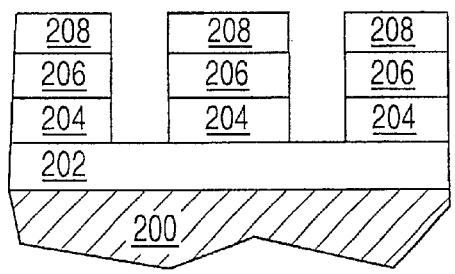

An image of a pattern is introduced into the layer of energy sensitive resist material 208 by exposing such energy sensitive resist material 208 to UV radiation via mask 210. The image of the pattern introduced into the layer of energy sensitive resist material 208 is developed in an appropriate developer to define the pattern therethrough, as shown in FIG. 2c. Thereafter, referring to FIG. 2d, the pattern defined in the energy sensitive resist material 208 is transferred through the silicon carbide layer 204. The pattern is transferred through the silicon carbide layer 204 using the energy sensitive resist material 208 as a mask. The pattern is transferred through the silicon carbide layer 204 using an appropriate chemical etchant. For example, fluorocarbon compounds such as trifluoromethane ($CF_3H$) may be used to chemically etch the silicon carbide layer 204.

Alternatively, when the intermediate layer 206 is present, the pattern defined in the energy sensitive resist material 208 is first transferred through the intermediate layer 206 using the energy sensitive resist material as a mask. Thereafter, the pattern is transferred through the silicon carbide layer 204 using the intermediate layer 206 as a mask. The pattern is transferred through both the intermediate layer 206 as well as the silicon carbide layer 204 using appropriate chemical etchants.

Figure 2E:
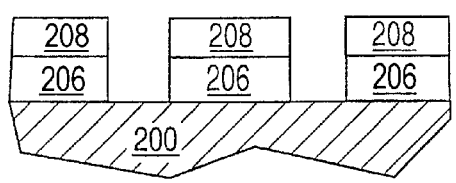

FIG. 2e illustrates the completion of the integrated circuit fabrication sequence by the transfer of the pattern defined in the silicon carbide layer 204 through the silicon dioxide layer 202 using the silicon carbide layer 204 as a hard mask. After the silicon dioxide layer 202 is patterned, the silicon carbide layer 204 can optionally be stripped from the substrate 200 by etching it in a suitable chemical etchant.

Silicon Nitride Hard Mask

Figure 3A:
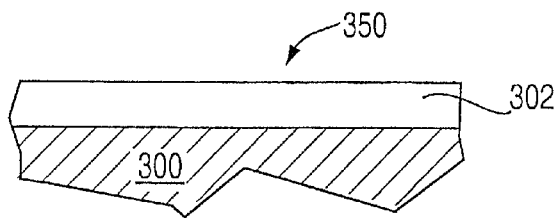
FIGS. 3a–3e illustrate a schematic cross-sectional views of a substrate structure at different stages of integrated circuit fabrication incorporating a silicon nitride layer as a hard mask.

FIGS. 3a–3e illustrate schematic cross-sectional views of a substrate 300 at different stages of an integrated circuit fabrication sequence incorporating a silicon nitride layer as a hard mask. In general, the substrate 300 refers to any workpiece on which processing is performed, and a substrate structure 350 is used to generally denote the substrate together with other material layers formed on the substrate 300. Depending on the specific stage of processing, the substrate 300 may correspond to a silicon wafer, or other material layer that has been formed on the silicon wafer. FIG. 3a, for example, illustrates a cross-sectional view of a substrate structure 350, having a material layer 302 that has been conventionally formed thereon. The material layer 302 may be an oxide (e.g., silicon dioxide, fluorosilicate glass (FSG)). In general, the substrate 300 may include a layer of silicon, silicides, metals, or other materials. FIG. 3a illustrates one embodiment in which the substrate 300 is silicon having a silicon dioxide layer formed thereon.

Figure 3B:
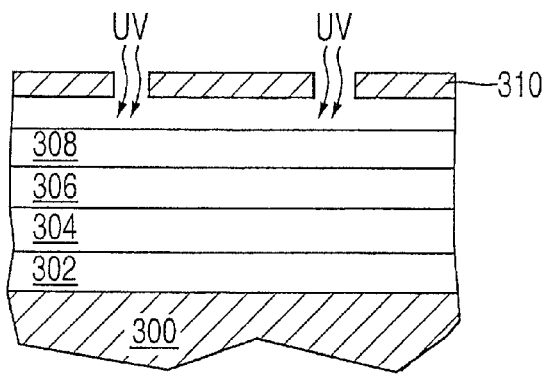

FIG. 3b depicts a silicon nitride layer 304 formed on the substrate structure 350 of FIG. 3a. The silicon nitride layer 304 is formed on the substrate structure 350 according to the process parameters described above. The thickness of the silicon nitride layer is variable depending on the specific stage of processing. Typically, the silicon nitride layer is deposited to a thickness of about 50 Å to about 1000 Å.

A layer of energy sensitive resist material 308 is formed on the silicon nitride layer 304. The layer of energy sensitive resist material 308 may be spin coated on the substrate to a thickness of within a range of about 4,000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 250 nm.

Dependent on the etch chemistry of the energy sensitive resist material used in the fabrication sequence, an intermediate layer 306 may be formed on the silicon nitride layer 304. When the energy sensitive resist material 308 and the silicon nitride layer 304 can be etched using the same chemical etchants or when resist poisoning may occur, the intermediate layer 306 functions as a mask for the silicon nitride layer 304. The intermediate layer 306 is conventionally formed on the silicon nitride layer 304. The intermediate layer 306 may be a silicon carbide cap layer, an oxide, amorphous silicon, or other suitable material layer.

Figure 3C:
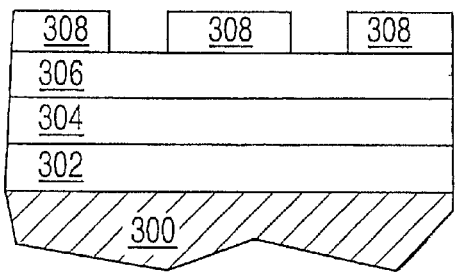
Figure 3D:
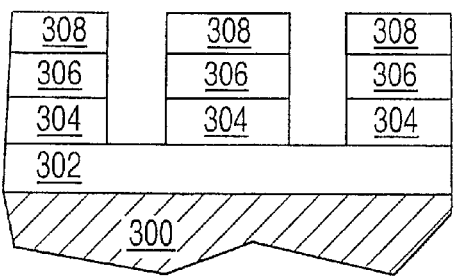

An image of a pattern is introduced into the layer of energy sensitive resist material 308 by exposing such energy sensitive resist material 308 to UV radiation via mask 310. The image of the pattern introduced into the layer of energy sensitive resist material 308 is developed in an appropriate developer to define the pattern therethrough, as shown in FIG. 3c. Thereafter, referring to FIG. 3d, the pattern defined in the energy sensitive resist material 308 is transferred through the silicon nitride layer 304. The pattern is transferred through the silicon nitride layer 304 using the energy sensitive resist material 308 as a mask. The pattern is transferred through the silicon nitride layer 304 using an appropriate chemical etchant. For example, fluorocarbon compounds such as trifluoromethane ($CF_3H$) may be used to chemically etch the silicon nitride layer 304.

Alternatively, when the intermediate layer 306 is present, the pattern defined in the energy sensitive resist material 308 is first transferred through the intermediate layer 306 using the energy sensitive resist material as a mask. Thereafter, the pattern is transferred through the silicon nitride layer 304 using the intermediate layer 306 as a mask. The pattern is transferred through both the intermediate layer 306 as well as the silicon nitride layer 304 using appropriate chemical etchants.

Figure 3E:
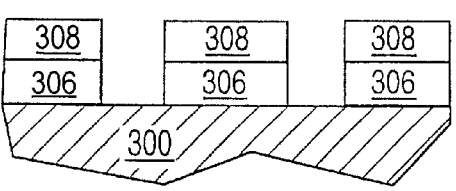

FIG. 3e illustrates the completion of the integrated circuit fabrication sequence by the transfer of the pattern defined in the silicon nitride layer 304 through the silicon dioxide layer 302 using the silicon nitride layer 304 as a hard mask. After the silicon dioxide layer 302 is patterned, the silicon nitride layer 204 may optionally be stripped from the substrate 200 by etching it in a suitable chemical etchant.

Silicon Carbide Anti-Reflective Coating (ARC)

Figure 4A:
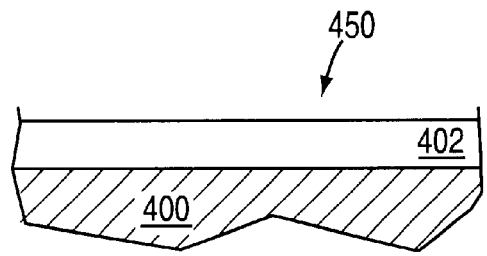
FIGS. 4a–4e illustrate schematic cross-sectional views of a substrate structure at different stages of integrated circuit fabrication incorporating a silicon carbide layer as an anti-reflective coating (ARC)

FIGS. 4a–4e illustrate schematic cross-sectional views of a substrate 400 at different stages of an integrated circuit fabrication sequence incorporating a silicon carbide layer as an anti-reflective coating (ARC). In general, the substrate 400 refers to any workpiece on which film processing is performed, and a substrate structure 450 is used to generally denote the substrate together with other material layers formed on the substrate 400. Depending on the specific stage of processing, substrate 400 may correspond to a silicon wafer or other material layer, which has been formed on the substrate 400. FIG. 4a, for example, illustrates a cross-sectional view of a substrate structure 450 in which the substrate 400 is a silicon wafer having an oxide layer thereon.

A silicon carbide layer 402 is formed on the substrate structure 450. The silicon carbide layer 402 is formed on the substrate structure 450 according to the process parameters described above. The silicon carbide layer 402 has an absorption coefficient ($\kappa$) that can be varied between about 0.1 to about 0.9 at wavelengths below about 250 nm (nanometers), making it suitable for use as an anti-reflective coating (ARC) at deep ultraviolet (DUV) wavelengths. The absorption coefficient ($\kappa$) of the silicon carbide layer 402 is tunable, in that it can be varied in the desired range as a function of the gas composition (e.g., carbon source concentration). The thickness of the silicon carbide layer 402 is variable depending on the specific stage of processing. Typically, the silicon carbide layer 402 has a thickness of about 200 Å to about 2,000 Å.

Figure 4B:
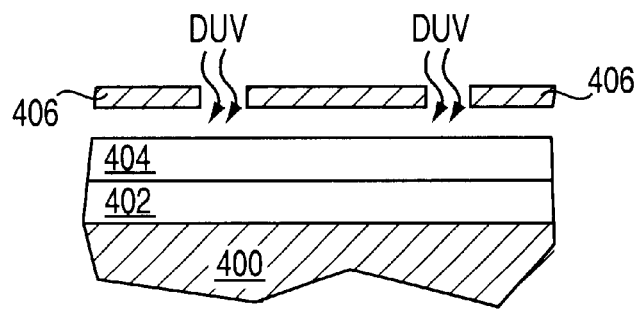

FIG. 4b depicts a layer of energy sensitive resist material 404 formed on the substrate structure 450 of FIG. 4a. The layer of energy sensitive resist material 404 can be spin coated on the substrate structure 450 to a thickness within a range of about 2,000 Å to about 6,000 Å. The energy sensitive resist material 404 is sensitive to DUV radiation having a wavelength less than 250 nm.

An image of a pattern is introduced into the layer of energy sensitive resist material 404 by exposing such layer to DUV radiation via mask 406. When the image of the pattern is introduced into the layer of energy sensitive resist material 404, the silicon carbide layer 402 suppresses any reflections off underlying material layers (e.g., oxides, metals) which can degrade the image of the pattern introduced in the layer of energy sensitive resist material 404.

Figure 4C:
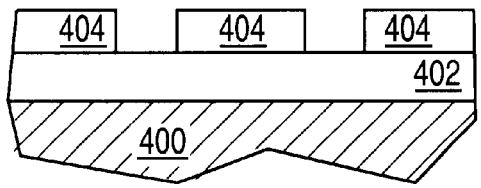
Figure 4D:
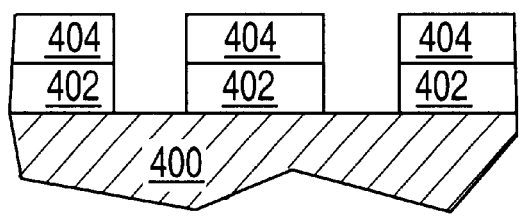

The image of the pattern introduced into the layer of energy sensitive resist material 404 is developed in an appropriate developer to define the pattern through such layer, as shown in FIG. 4c. Thereafter, referring to FIG. 4d, the pattern defined in the energy sensitive resist material 404 is transferred through the silicon carbide layer 402. The pattern is transferred through the silicon carbide layer 402 using the energy sensitive resist material mask. The pattern is transferred through the silicon carbide layer 402 by etching it using an appropriate chemical etchant (e.g., trifluoromethane ($CF_3H$)).

Figure 4E:
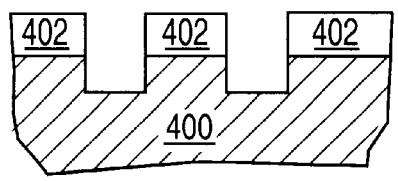

After the silicon carbide layer 402 is patterned, such pattern is typically transferred into the substrate 400, as shown in FIG. 4e. The pattern is transferred into the substrate 400 using the silicon carbide ARC layer 402 as a hard mask. The pattern is transferred into the substrate 400 by etching it using an appropriate chemical etchant. Thereafter, the silicon carbide ARC layer 402 is optionally removed from the substrate structure 450 by etching it using an appropriate chemical etchant (e.g., trifluoromethane ($CF_3H$)).

Silicon Nitride Anti-Reflective Coating (ARC)

Figure 5A:
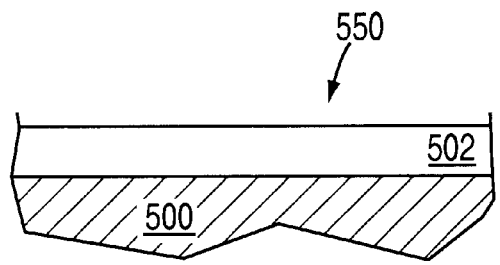
FIGS. 5a–5e illustrate schematic cross-sectional views of a substrate structure at different stages of integrated circuit fabrication incorporating a silicon nitride layer as an anti-reflective coating (ARC)

FIGS. 5a–5e illustrate schematic cross-sectional views of a substrate 500 at different stages of an integrated circuit fabrication sequence incorporating a silicon nitride layer as an anti-reflective coating (ARC). In general, the substrate 500 refers to any workpiece on which film processing is performed, and a substrate structure 550 is used to generally denote the substrate together with other material layers formed on the substrate 500. Depending on the specific stage of processing, substrate 500 may correspond to a silicon wafer or other material layer, which has been formed on the substrate 500. FIG. 5a, for example, illustrates a cross-sectional view of a substrate structure 550 in which the substrate 500 is a silicon wafer having an oxide layer thereon.

A silicon nitride layer 502 is formed on the substrate structure 550. The silicon nitride layer 502 is formed on the substrate structure 550 according to the process parameters described above. The silicon nitride layer 502 has an absorption coefficient ($\kappa$) that can be varied between about 0.1 to about 0.9 at wavelengths below about 250 nm (nanometers), making it suitable for use as an anti-reflective coating (ARC) at deep ultraviolet (DUV) wavelengths. The absorption coefficient ($\kappa$) of the silicon nitride layer 502 is tunable, in that it can be varied in the desired range as a function of the gas composition (e.g., silicon source concentration). The thickness of the silicon nitride layer 502 is variable depending on the specific stage of processing. Typically, the silicon nitride layer 502 has a thickness of about 200 Å to about 2,000 Å.

Figure 5B:
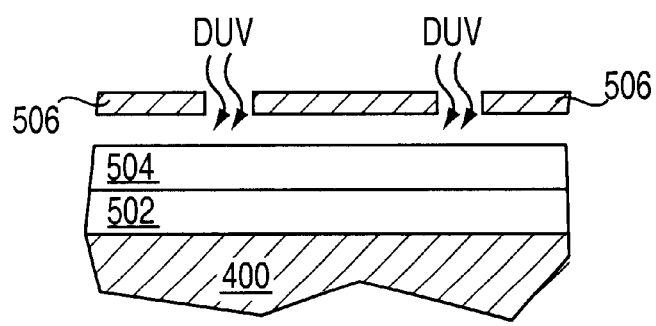

FIG. 5b depicts a layer of energy sensitive resist material 504 formed on the substrate structure 550 of FIG. 5a. The layer of energy sensitive resist material 504 can be spin coated on the substrate structure 550 to a thickness within a range of about 2,000 Å to about 6,000 Å. The energy sensitive resist material 504 is sensitive to DUV radiation having a wavelength less than 250 nm.

An image of a pattern is introduced into the layer of energy sensitive resist material 504 by exposing such layer to DUV radiation via mask 506. When the image of the pattern is introduced into the layer of energy sensitive resist material 504, the silicon nitride layer 502 suppresses any reflections off underlying material layers (e.g., oxides, metals) which can degrade the image of the pattern introduced in the layer of energy sensitive resist material 504.

Figure 5C:
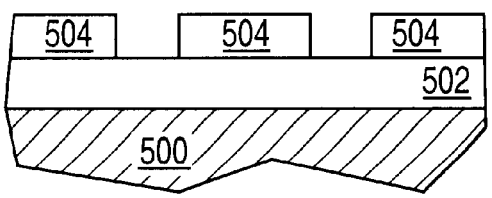
Figure 5D:
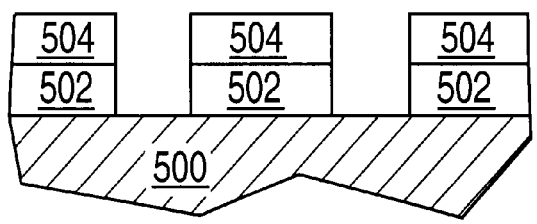

The image of the pattern introduced into the layer of energy sensitive resist material 504 is developed in an appropriate developer to define the pattern through such layer, as shown in FIG. 5c. Thereafter, referring to FIG. 5d, the pattern defined in the energy sensitive resist material 504 is transferred through the silicon nitride layer 502. The pattern is transferred through the silicon nitride layer 502 using the energy sensitive resist material 504 as a mask. The pattern is transferred through the silicon nitride layer 502 by etching it using an appropriate chemical etchant (e.g., trifluoromethane ($CF_3H$)).

Figure 5E:
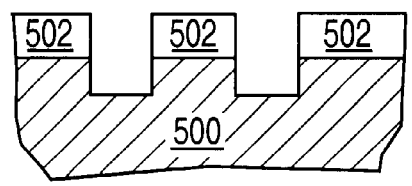

After the silicon nitride layer 502 is patterned, such pattern is typically transferred into the substrate 500, as shown in FIG. 5e. The pattern is transferred into the substrate 500 using the silicon nitride ARC layer 502 as a hard mask. The pattern is transferred into the substrate 500 by etching it using an appropriate chemical etchant. Thereafter, the silicon nitride ARC layer 502 is optionally removed from the substrate structure 550 by etching it using an appropriate chemical etchant (e.g., trifluoromethane ($CF_3H$)).

Organosilicate Anti-Reflective Coating (ARC)

Figure 6A:
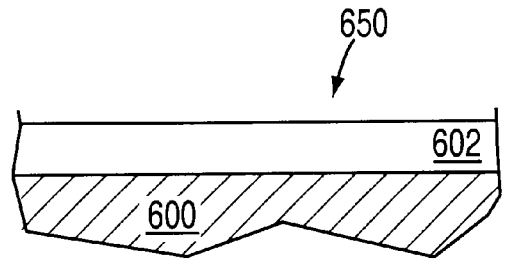
FIGS. 6a–6e illustrate schematic cross-sectional views of a substrate structure at different stages of integrated circuit fabrication incorporating an organosilicate layer as an anti-reflective coating (ARC)

FIGS. 6a–6e illustrate schematic cross-sectional views of a substrate 600 at different stages of an integrated circuit fabrication sequence incorporating an organosilicate layer as an anti-reflective coating (ARC). In general, the substrate 600 refers to any workpiece on which film processing is performed, and a substrate structure 650 is used to generally denote the substrate together with other material layers formed on the substrate 600. Depending on the specific stage of processing, substrate 600 may correspond to a silicon wafer or other material layer, which has been formed on the substrate 600. FIG. 6a, for example, illustrates a cross-sectional view of a substrate structure 650 in which the substrate 600 is a silicon wafer having an oxide layer thereon.

An organosilicate layer 602 is formed on the substrate structure 650. The organosilicate layer 602 is formed on the substrate structure 650 according to the process parameters described above. The organosilicate layer 602 has an absorption coefficient ($\kappa$) that can be varied between about 0.1 to about 0.9 at wavelengths below about 250 nm (nanometers), making it suitable for use as an anti-reflective coating (ARC) at deep ultraviolet (DUV) wavelengths. The absorption coefficient ($\kappa$) of the organosilicate layer 602 is tunable, in that it can be varied in the desired range as a function of the gas composition (e.g., carbon source concentration). The thickness of the organosilicate layer 602 is variable depending on the specific stage of processing. Typically, the organosilicate layer 602 has a thickness of about 200 Å to about 2,000 Å.

Figure 6B:
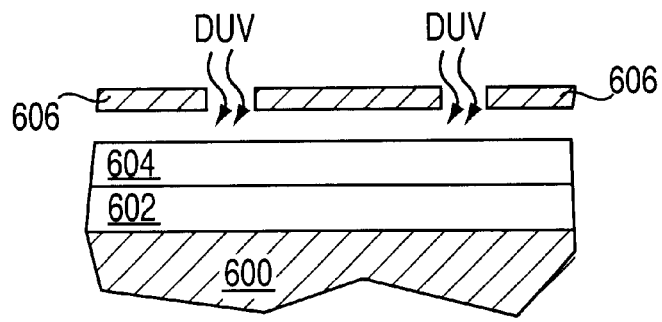

FIG. 6b depicts a layer of energy sensitive resist material 604 formed on the substrate structure 650 of FIG. 6a. The layer of energy sensitive resist material 604 can be spin coated on the substrate structure 650 to a thickness within a range of about 2,000 Å to about 6,000 Å. The energy sensitive resist material 604 is sensitive to DUV radiation having a wavelength less than 250 nm.

An image of a pattern is introduced into the layer of energy sensitive resist material 604 by exposing such layer to DUV radiation via mask 606. When the image of the pattern is introduced into the layer of energy sensitive resist material 604, the organosilicate layer 602 suppresses any reflections off underlying material layers (e.g., oxides, metals) which can degrade the image of the pattern introduced in the layer of energy sensitive resist material 604.

Figure 6C:
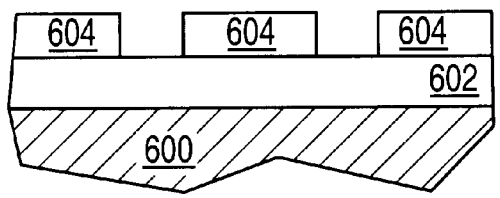
Figure 6D:
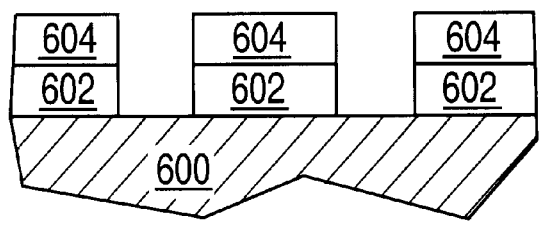

The image of the pattern introduced into the layer of energy sensitive resist material 604 is developed in an appropriate developer to define the pattern through such layer, as shown in FIG. 6c. Thereafter, referring to FIG. 6d, the pattern defined in the energy sensitive resist material 604 is transferred through the organosilicate layer 602. The pattern is transferred through the organosilicate layer 602 using the energy sensitive resist material 604 as a mask. The pattern is transferred through the organosilicate layer 602 by etching it using an appropriate chemical etchant (e.g., trifluoromethane ($CF_3H$)).

Figure 6E:
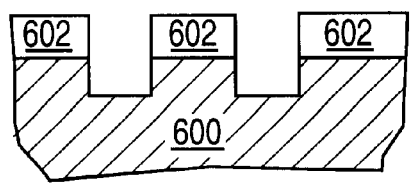

After the organosilicate layer 602 is patterned, such pattern is typically transferred into the substrate 600, as shown in FIG. 6e. The pattern is transferred into the substrate 600 using the organosilicate ARC layer 602 as a hard mask. The pattern is transferred into the substrate 600 by etching it using an appropriate chemical etchant. Thereafter, the organosilicate ARC layer 602 is optionally removed from the substrate structure 650 by etching it using an appropriate chemical etchant (e.g., trifluoromethane ($CF_3H$)).

Damascene Structure Incorporating a Silicon Carbide Layer

Figure 7A:
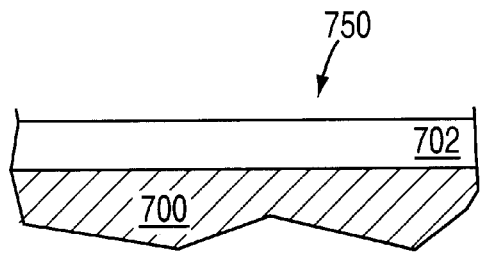
FIGS. 7a–7g illustrate schematic cross-sectional views of a damascene structure at different stages of integrated circuit fabrication incorporating a silicon carbide layer as both a hard mask and a barrier layer.

FIGS. 7a–7g illustrate schematic cross-sectional views of a substrate 700 at different stages of a dual damascene structure fabrication sequence incorporating a silicon carbide barrier layer as well as a silicon carbide hard mask. Dual damascene structures are typically used to form multilayer metal interconnects on integrated circuits. Depending on the specific stage of processing, substrate 700 may correspond to a silicon wafer, or other material layer that has been formed on the substrate 700. FIG. 7a, for example, illustrates a cross-sectional view of a substrate 700 having a metal layer 702 (e.g., copper (Cu), aluminum (Al), tungsten (W)) formed thereon.

FIG. 7a illustrates one embodiment in which the substrate 700 is silicon having a copper (Cu) layer formed thereon. The copper layer 702 has a thickness of about 5,000 Å to about 5 microns, depending on the size of the structure to be fabricated.

Figure 7B:
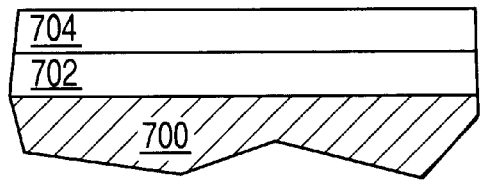

Referring to FIG. 7b, a silicon carbide barrier layer 704 is formed on the copper layer 702. The silicon carbide barrier layer 704 is formed on the copper layer 702 according to the process parameters described above. The silicon carbide barrier layer 704 has a dielectric constant less than about 5.5. The dielectric constant can be varied as a function of the gas composition (e.g., fluorine source concentration and/or carbon source concentration) during layer formation. The thickness of the silicon carbide barrier layer 704 is variable depending on the specific stage of processing. Typically, the silicon carbide barrier layer 704 has a thickness of about 200 Å to about 1,000 Å.

Figure 7C:
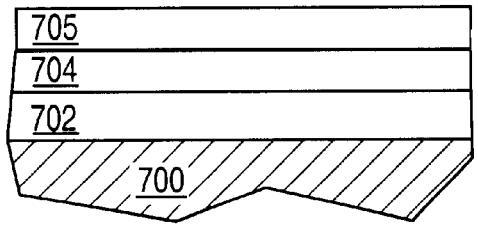

A first dielectric layer 705 is formed on the silicon carbide barrier layer 704, as illustrated in FIG. 7c. The first dielectric layer 705 may be an oxide (e.g., silicon dioxide, fluorosilicate glass (FSG)). The first dielectric layer 705 has a thickness of about 5,000 Å to about 10,000 Å.

Figure 7D:
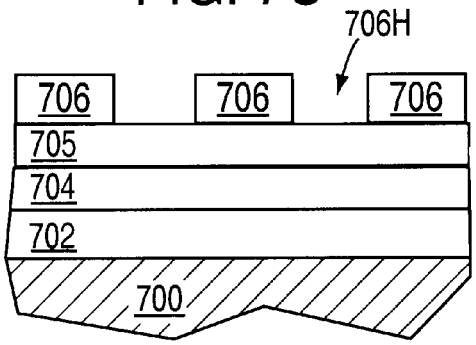

Referring to FIG. 7d, a silicon carbide hard mask layer 706 is formed on the first dielectric layer 705, patterned and etched to defined vias therein. The silicon carbide hard mask layer 706 is formed on the first dielectric layer 705 according to the process parameters described above. The silicon carbide hard mask layer 705 has a dielectric constant less than about 5.5. The dielectric constant of the silicon carbide hard mask layer can be varied as a function of the gas composition (e.g., fluorine source concentration and/or carbon source concentration) during layer formation.

The thickness of the silicon carbide hard mask layer 706 is variable depending on the specific stage of processing. Typically, the silicon carbide hard mask layer 706 has a thickness of about 200 Å to about 1,000 Å.

Figure 7E:
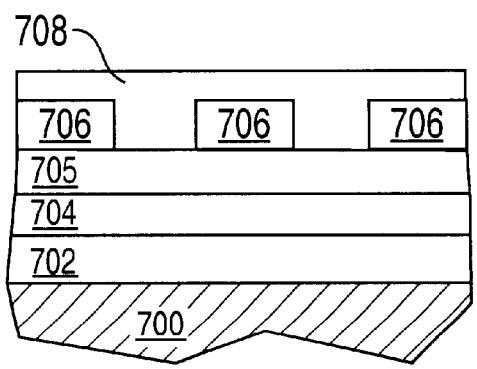

Referring to FIG. 7e, after the silicon carbide hard mask layer 706 is patterned, a second dielectric layer 708 is deposited thereover. The second dielectric layer 708 may be an oxide (e.g., silicon dioxide, fluorosilicate glass (FSG)). The thickness of the second dielectric layer 708 is variable depending on the specific stage of processing. Typically, the second dielectric layer 708 has a thickness of about 5,000 Å to about 10,000 Å.

Figure 7F:
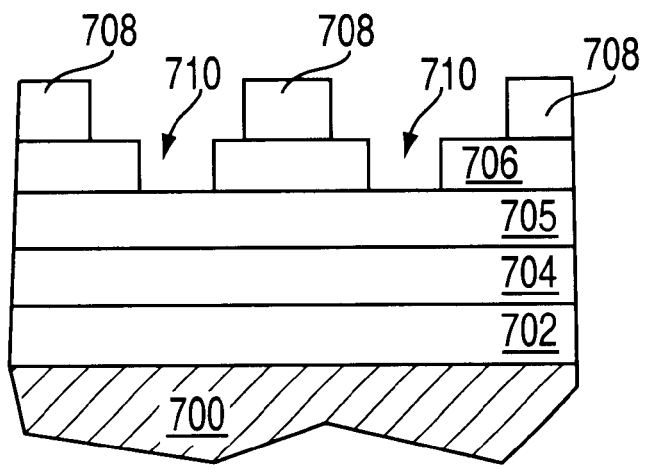
Figure 7G:
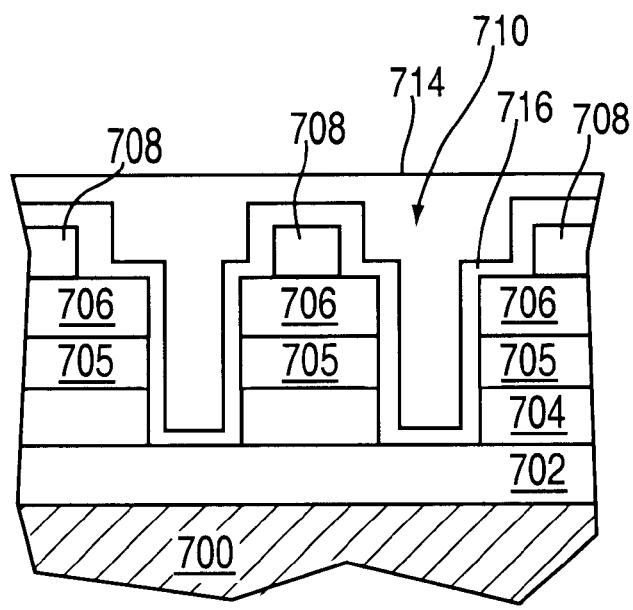

The second dielectric layer 708 is then patterned to define interconnect lines 710, as illustrated in FIG. 7f, preferably using conventional lithography processes described above. The interconnect lines 710 formed in the second dielectric layer 708 are positioned over the via openings 706H formed in the silicon carbide hard mask layer 706. Thereafter, as shown in FIG. 7g, the vias 706H are transferred through the first dielectric layer 704 and the barrier layer 704 by etching them using reactive ion etching or other anisotropic etching techniques.

The interconnect lines 710 and the vias 706H are filled with a conductive material 714 such as aluminum (Al), copper (Cu), tungsten (W), or combinations thereof. Preferably copper (Cu) is used to fill the interconnect lines 710 and the vias 706H due to its low resistivity (resistivity of about 1.7 $\mu\Omega$-cm). The conductive material 714 may be deposited using chemical vapor deposition (CVD) techniques, physical vapor deposition (PVD) techniques, electroplating techniques, or combinations thereof, to form the damascene structure.

Additionally, a barrier layer 716 such as tantalum (Ta), tantalum nitride (TaN), or other suitable barrier material may be deposited conformably on the sidewalls of the interconnect lines 710 and the vias 706H, before filling them with the conductive material 714, to prevent metal migration into the surrounding first and second dielectric layers 705, 708, as well as the barrier layer 704 and the hard mask layer 706.

Damascene Structure Incorporating a Silicon Nitride Layer

Figure 8A:
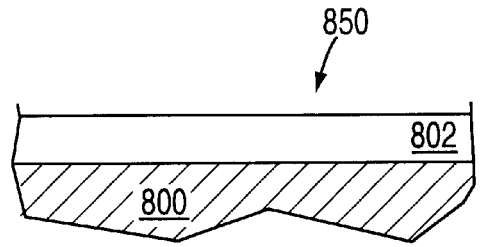
FIGS. 8a–8g illustrate schematic cross-sectional views of a damascene structure at different stages of integrated circuit fabrication incorporating a silicon nitride layer as both a hard mask and a barrier layer.

FIGS. 8a–8g illustrate schematic cross-sectional views of a substrate 800 at different stages of a dual damascene structure fabrication sequence incorporating a silicon nitride barrier layer as well as a silicon nitride hard mask. Dual damascene structures are typically used to form multi-layer metal interconnects on integrated circuits. Depending on the specific stage of processing, substrate 800 may correspond to a silicon wafer, or other material layer that has been formed on the substrate 800. FIG. 8a, for example, illustrates a cross-sectional view of a substrate 800 having a metal layer 802 (e.g., copper (Cu), aluminum (Al), tungsten (W)) formed thereon.

FIG. 8a illustrates one embodiment in which the substrate 800 is silicon having a copper (Cu) layer formed thereon. The copper layer 802 has a thickness of about 5,000 Å to about 5 microns, depending on the size of the structure to be fabricated.

Figure 8B:
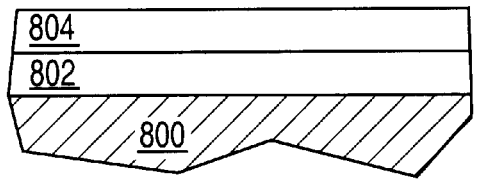

Referring to FIG. 8b, a silicon nitride barrier layer 804 is formed on the copper layer 802. The silicon nitride barrier layer 804 is formed on the copper layer 802 according to the process parameters described above. The silicon nitride barrier layer 804 has a dielectric constant less than about 7. The dielectric constant can be varied as a function of the gas composition (e.g., fluorine source concentration and/or silicon source concentration) during layer formation. The thickness of the silicon nitride barrier layer 804 is variable depending on the specific stage of processing. Typically, the silicon nitride barrier layer 804 has a thickness of about 200 Å to about 1,000 Å.

Figure 8C:
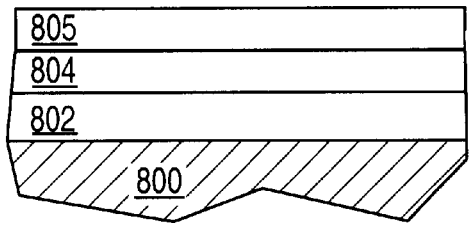

A first dielectric layer 805 is formed on the silicon nitride barrier layer 804, as illustrated in FIG. 8c. The first dielectric layer 805 may be an oxide (e.g., silicon dioxide, fluorosilicate glass (FSG)). The first dielectric layer 805 has a thickness of about 5,000 Å to about 10,000 Å.

Figure 8D:
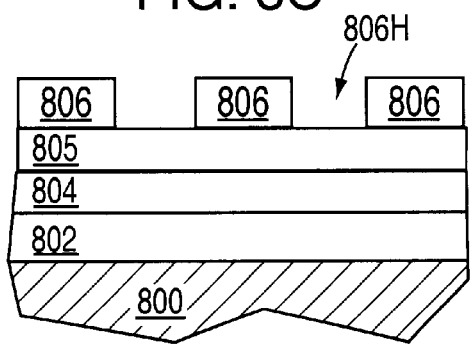

Referring to FIG. 8d, a silicon nitride hard mask layer 806 is formed on the first dielectric layer 805, patterned and etched to defined vias therein. The silicon nitride hard mask layer 806 is formed on the first dielectric layer 805 according to the process parameters described above. The silicon nitride hard mask layer 805 has a dielectric constant less than about 7. The dielectric constant of the silicon nitride hard mask layer can be varied as a function of the gas composition (e.g., silicon source and fluorine source concentrations) during layer formation.

The thickness of the silicon nitride hard mask layer 806 is variable depending on the specific stage of processing. Typically, the silicon nitride hard mask layer 806 has a thickness of about 200 Å to about 1,000 Å.

Figure 8E:
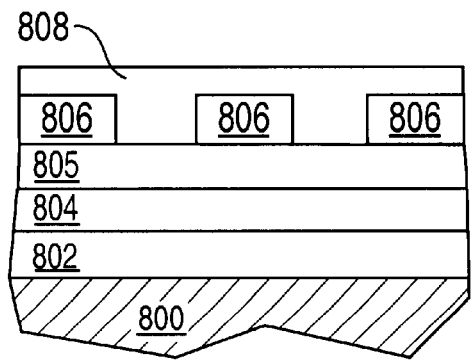

Referring to FIG. 8e, after the silicon nitride hard mask layer 806 is patterned, a second dielectric layer 808 is deposited thereover. The second dielectric layer 808 may be an oxide (e.g., silicon dioxide, fluorosilicate glass (FSG)). The thickness of the second dielectric layer 808 is variable depending on the specific stage of processing. Typically, the second dielectric layer 812 has a thickness of about 5,000 Å to about 10,000 Å.

Figure 8F:
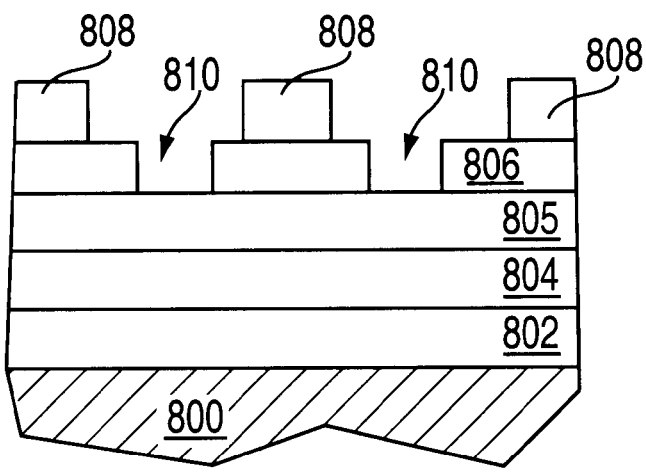
Figure 8G:
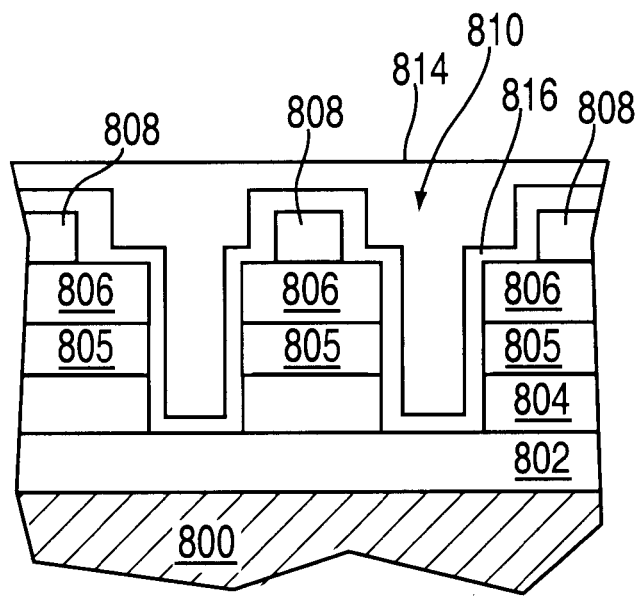

The second dielectric layer 808 is then patterned to define interconnect lines 810, as illustrated in FIG. 8f, preferably using conventional lithography processes described above. The interconnect lines 810 formed in the second dielectric layer 808 are positioned over the via openings 806H formed in the silicon nitride hard mask layer 806. Thereafter, as shown in FIG. 8g, the vias 806H are transferred through the first dielectric layer 804 and the silicon nitride barrier layer 804 by etching them using reactive ion etching or other anisotropic etching techniques.

The interconnect lines 810 and the vias 806H are filled with a conductive material 814 such as aluminum (Al), copper (Cu), tungsten (W), or combinations thereof. Preferably copper (Cu) is used to fill the interconnect lines 810 and the vias 806H due to its low resistivity (resistivity of about 1.7 $\mu\Omega$-cm). The conductive material 814 may be deposited using chemical vapor deposition (CVD) techniques, physical vapor deposition (PVD) techniques, electroplating techniques, or combinations thereof, to form the damascene structure.

Additionally, a barrier layer 816 such as tantalum (Ta), tantalum nitride (TaN), or other suitable barrier material may be deposited conformably on the sidewalls of the interconnect lines 810 and the vias 806H, before filling them with the conductive material 814, to prevent metal migration into the surrounding first and second dielectric layers 805, 808, as well as the silicon nitride barrier layer 804 and the silicon nitride hard mask layer 806.

Damascene Structure Incorporating Organosilicate Dielectric Layers

Figure 9A:
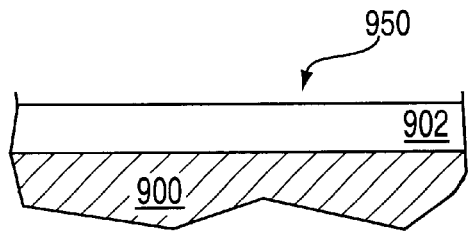
FIGS. 9a–9g illustrate schematic cross-sectional views of a damascene structure at different stages of integrated circuit fabrication incorporating organosilicate layers as the bulk insulating material layers.

FIGS. 9a–9g illustrate schematic cross-sectional views of a substrate 900 at different stages of a dual damascene structure fabrication sequence incorporating organosilicate layers as low dielectric constant insulating layers. Dual damascene structures are typically used to form multi-layer metal interconnects on integrated circuits. Depending on the specific stage of processing, substrate 900 may correspond to a silicon wafer, or other material layer that has been formed on the substrate 900. FIG. 9a, for example, illustrates a cross-sectional view of a substrate 900 having a metal layer 902 (e.g., copper (Cu), aluminum (Al), tungsten (W)) formed thereon.

FIG. 9a illustrates one embodiment in which the substrate 900 is silicon having a copper (Cu) layer formed thereon. The copper layer 902 has a thickness of about 5,000 Å to about 5 microns, depending on the size of the structure to be fabricated.

Figure 9B:
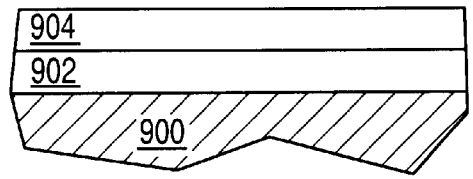

Referring to FIG. 9b, a barrier layer 904 is formed on the copper layer 902. The barrier layer 904 may be a silicon carbide layer, or a silicon nitride layer, among others. The thickness of the barrier layer 904 is variable depending on the specific stage of processing. Typically, the barrier layer 904 has a thickness of about 200 Å to about 1,000 Å.

Figure 9C:
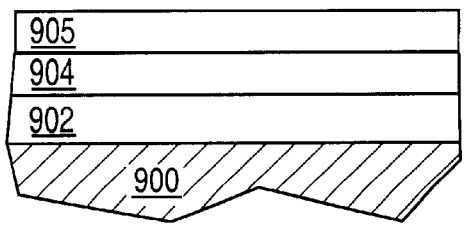

A first organosilicate layer 905 is formed on the barrier layer 904, as illustrated in FIG. 9c. The first organosilicate layer 905 is formed on the barrier layer 904 according to the process parameters described above. The organosilicate layer 905 has a dielectric constant less than about 3.5. The dielectric constant can be varied as a function of the gas composition (e.g., carbon source concentration and/or fluorine source concentration) during layer formation. The first organosilicate layer 905 has a thickness of about 5,000 Å to about 10,000 Å.

Figure 9D:
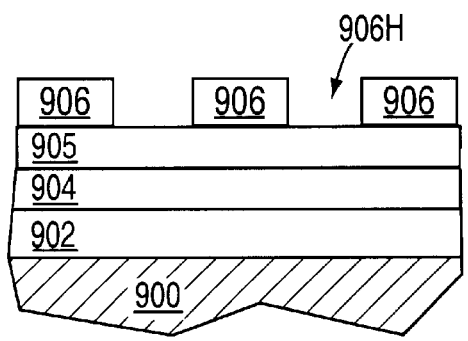

Referring to FIG. 9d, a hard mask layer 906 is formed on the first organosilicate layer 905, patterned and etched to defined vias therein. The hard mask layer 906 may be a silicon carbide layer, or a silicon nitride layer, among others. The thickness of the hard mask layer 906 is variable depending on the specific stage of processing. Typically, the hard mask layer 906 has a thickness of about 200 Å to about 1,000 Å.

Figure 9E:
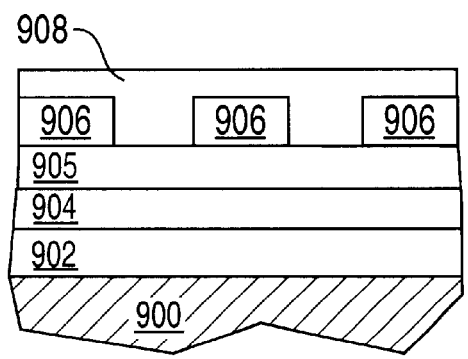

Referring to FIG. 9e, after the hard mask layer 906 is patterned, a second organosilicate layer 908 is deposited thereover. The second organosilicate layer 908 is deposited according to the process parameters described above. The thickness of the second organosilicate layer 908 is variable depending on the specific stage of processing. Typically, the second organosilicate layer 908 has a thickness of about 5,000 Å to about 10,000 Å.

Figure 9F:
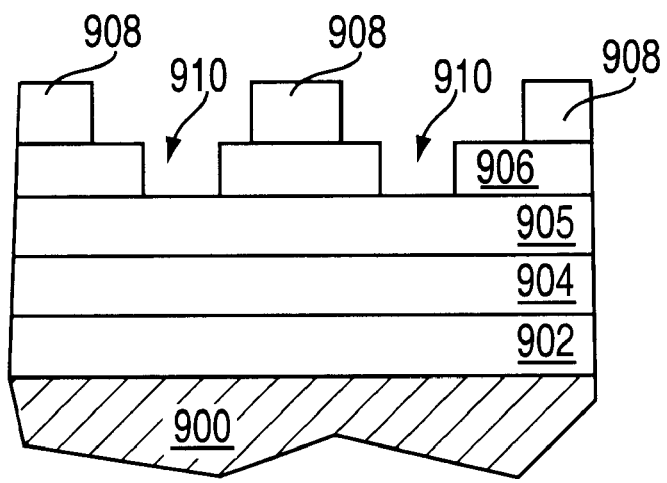
Figure 9G:
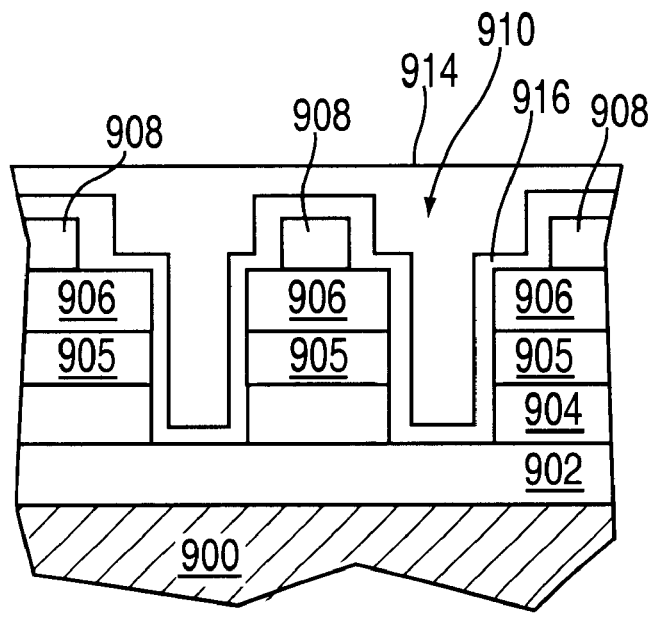

The second organosilicate layer 908 is then patterned to define interconnect lines 910, as illustrated in FIG. 9f, preferably using conventional lithography processes described above. The interconnect lines 910 formed in the second organosilicate layer 908 are positioned over the via openings 906H formed in the hard mask layer 906. Thereafter, as shown in FIG. 9g, the vias 906H are transferred through the first organosilicate layer 905 and the barrier layer 904 by etching them using reactive ion etching or other anisotropic etching techniques.

The interconnect lines 910 and the vias 906H are filled with a conductive material 914 such as aluminum (Al), copper (Cu), tungsten (W), or combinations thereof. Preferably copper (Cu) is used to fill the interconnect lines 910 and the vias 906H due to its low resistivity (resistivity of about 1.7 $\mu\Omega$-cm). The conductive material 914 may be deposited using chemical vapor deposition (CVD) techniques, physical vapor deposition (PVD) techniques, electroplating techniques, or combinations thereof, to form the damascene structure.

Additionally, a barrier layer 916 such as tantalum (Ta), tantalum nitride (TaN), or other suitable barrier material may be deposited conformably on the sidewalls of the interconnect lines 910 and the vias 906H, before filling them with the conductive material 914, to prevent metal migration into the surrounding first and second organosilicate layers 905, 908, as well as the barrier layer 904 and the hard mask layer 906.

Although several preferred embodiments which incorporate the teachings of the present invention have been shown and described in detail, those skilled in the art can readily devise many other varied embodiments that still incorporate these teachings.

What is claimed is:

1. A method of forming a device, comprising:
   (a) forming a fluorine-containing silicon carbide layer on a substrate in a deposition chamber, wherein the fluorine-containing silicon carbide layer is formed by reacting a gas mixture comprising a silicon source, a carbon source, and a fluorine source in the presence of an electric field;
   (b) defining a pattern in at least one region of the fluorine-containing silicon carbide layer; and
   (c) transferring the pattern defined in the at least one region of the fluorine-containing silicon carbide layer into the substrate using the fluorine-containing silicon carbide layer as a mask.

2. The method of claim 1, further comprising removing the fluorine-containing silicon carbide layer from the substrate.

3. The method of claim 2 wherein the fluorine-containing silicon carbide layer is removed from the substrate using a fluorine-based compound.

4. The method of claim 3 wherein the fluorine-based compound is selected from the group of carbon tetrafluoride ($CF_4$) and trifluoromethane ($CF_3H$).

5. The method of claim 1 wherein the substrate has one or more material layers formed thereon.

6. The method of claim 1 wherein definition of the pattern in the at least one region of the fluorine-containing silicon carbide layer, comprises:
   (c) forming a layer of energy sensitive resist material on the fluorine-containing silicon carbide layer;
   (d) introducing an image of the pattern into the layer of energy sensitive resist material by exposing the energy sensitive resist material to patterned radiation;
   (e) developing the image of the pattern introduced into the layer of energy sensitive resist material; and
   (f) transferring the pattern through the fluorine-containing silicon carbide layer using the layer of energy sensitive resist material as a mask.

7. The method of claim 6 further comprising:
   (g) forming an intermediate layer on the fluorine-containing silicon carbide layer prior to forming the layer of energy sensitive resist material thereon, introducing the image of the pattern therein, and developing the pattern;
   (h) transferring the image of the pattern developed in the layer of energy sensitive resist material through the intermediate layer using the layer of energy sensitive resist material as a mask; and
   (i) transferring the pattern through the fluorine-containing silicon carbide layer using the intermediate layer as a mask.

8. The method of claim 7 wherein the intermediate layer is an oxide.

9. The method of claim 8 wherein the oxide is selected from the group of silicon dioxide and fluorosilicate glass (FSG).

10. The method of claim 1 wherein the fluorine-containing silicon carbide layer is an anti-reflective coating (ARC) to actinic radiation at wavelengths less than about 250 nm (nanometers).

11. The method of claim 1 wherein the fluorine-containing silicon carbide layer has an absorption coefficient (k) within a range of about 0.1 to about 0.9 to actinic radiation at wavelengths less than about 250 nm.

12. The method of claim 11 wherein the absorption coefficient ($\kappa$) varies within a range of about 0.1 to about 0.9 across the thickness of the fluorine-containing silicon carbide layer.

13. The method of claim 1 wherein the fluorine-containing silicon carbide layer has an index of refraction within a range of about 1.6 to about 2.2.

14. The method of claim 11 wherein the silicon source and the carbon source comprise an organosilane compound having the general formula $Si_xC_yH_z$, wherein x has a range of 1 to 2, y has a range of 1 to 6, and z has a range of 4 to 18.

15. The method of claim 14 wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), diethylsilane ($SiC_4H_{12}$), and combinations thereof.

16. The method of claim 1 wherein the silicon source and the carbon source are selected from the group of silane ($SiH_4$), methane ($CH_4$), disilane ($SiH_6$), and combinations thereof.

17. The method of claim 1 wherein the fluorine source is selected from the group of carbon tetrafluoride ($CF_4$), fluoroethane ($C_2F_6$), trifluoromethane ($CHF_3$), difluoromethane ($CH_2F_2$), and nitrogen fluoride ($NF_3$), and combinations thereof.

18. The method of claim 1 wherein the gas mixture further comprises an inert gas.

19. The method of claim 18 wherein the inert gas is selected from the group of helium (He), argon (Ar), neon (Ne), and combinations thereof.

20. The method of claim 1 wherein the ratio of the silicon source to the fluorine source in the gas mixture has a range of about 1:1 to about 1:100.

21. The method of claim 1 wherein the substrate is heated to a temperature between about 150° C. to about 450° C.

22. The method of claim 1 wherein the deposition chamber is maintained at a pressure between about 1 torr to about 15 torr.

23. The method of claim 1 wherein either of the silicon source or the carbon source is provided to the deposition chamber at a flow rate within a range of about 10 sccm to about 2,000 sccm.

24. The method of claim 1 wherein the fluorine source is provided to the deposition chamber at a flow rate in a range of about 50 sccm to about 10,000 sccm.

25. The method of claim 1 wherein the electric field is generated from one or more radio frequency (RF) powers.

26. The method of claim 25 wherein each of the one or more RF powers is in a range of about 1 watt/cm$^2$ to about 10 watts/cm$^2$.

27. The method of claim 1 wherein the fluorine-containing silicon carbide layer has a dielectric constant less than about 5.5.

28. The method of claim 1, further comprising the step of plasma treating the fluorine-containing silicon carbide layer.

29. The method of claim 28 wherein the fluorine-containing silicon carbide layer is plasma treated by:
providing one or more inert gas to a process chamber having the substrate therein with the fluorine-containing silicon carbide layer formed thereon; and
applying an electric field to the one or more inert gas to generate a plasma in the process chamber.

30. The method of claim 29 wherein the one or more inert gas is selected from the group of helium (He), argon (Ar), neon (Ne), and combinations thereof.

31. The method of claim 29 wherein the process chamber is maintained at a pressure within a range of about 5 torr to about 10 torr.

32. The method of claim 29 wherein the one or more inert gas is provided to the deposition chamber at a flow rate within a range of about 1,000 sccm to about 7,000 sccm.

33. The method of claim 29 wherein the electric field is a radio frequency (RF) power.

34. The method of claim 33 wherein the RF power is within a range of about 1 watt/cm$^2$ to about 10 watts/cm$^2$.

35. A method of fabricating a metal interconnect structure, comprising:
(a) providing a substrate having a metal layer thereon;
(b) forming a fluorine-containing silicon carbide barrier layer on the metal layer, wherein the fluorine-containing silicon carbide barrier layer is formed by reacting a gas mixture comprising a silicon source, a carbon source, and a fluorine source in the presence of an electric field;
(c) forming a first dielectric layer on the fluorine-containing silicon carbide barrier layer;
(d) forming a fluorine-containing silicon carbide hard mask on the first dielectric layer, wherein the fluorine-containing silicon carbide hard mask is formed by reacting a silicon source, a carbon source, and a fluorine source in the presence of an electric field;
(e) patterning the fluorine-containing silicon carbide hard mask to define vias therethrough;
(f) forming a second dielectric layer on the patterned fluorine-containing silicon carbide hard mask;
(g) patterning the second dielectric layer to define interconnects therethrough, wherein the interconnects are positioned over the vias defined in the fluorine-containing silicon carbide hard mask;
(h) transferring the via pattern through the first dielectric layer using the fluorine-containing silicon carbide hard mask as a mask;
(i) forming the vias through the fluorine-containing silicon carbide barrier layer; and
(j) filling the vias and interconnects with a conductive material.

36. The method of claim 35 wherein the first dielectric layer and the second dielectric layer each have dielectric constants less than about 3.

37. The method of claim 35 wherein the fluorine-containing silicon carbide barrier layer and the fluorine-containing silicon carbide hard mask each have dielectric constants less than about 5.5.

38. The method of claim 35 wherein the conductive material filling the vias and interconnects has a resistivity less than about 5 $\mu\Omega$-cm (micro-ohms-centimeters).

39. The method of claim 35 wherein the first dielectric layer and the second dielectric layer are selected from the group of silicon oxide and fluorosilicate glass (FSG).

40. The method of claim 35 wherein the conductive material filling the vias and the interconnects is selected from the group of copper (Cu), aluminum (Al), tungsten (W), and combinations thereof.

41. The method of claim 35 wherein the metal layer on the substrate is selected from the group of copper (Cu), aluminum (Al), tungsten (W), and combinations thereof.

42. The method of claim 35 wherein either of the silicon source or the carbon source of steps (b) and (d) comprise an organosilane compound having the general formula $Si_xC_yH_x$, wherein x has a range of 1 to 2, y has a range of 1 to 6, and z has a range of 4 to 18.

43. The method of claim 42 wherein the organosilane compound is selected from the group of methylsilane ($SiCH_6$), dimethylsilane ($SiC_2H_8$), trimethylsilane ($SiC_3H_{10}$), tetramethylsilane ($SiC_4H_{12}$), diethylsilane ($SiC_4H_{12}$), and combinations thereof.

44. The method of claim 35 wherein either of the silicon source or the carbon source of steps (b) and (d) is selected from the group of silane (SiH$_4$), methane (CH$_4$), disilane (Si$_2$H$_6$), and combinations thereof.

45. The method of claim 35 wherein the fluorine source of steps (b) and (d) is selected from the group of carbon tetrafluoride (CF$_4$), fluoroethane (C$_2$F$_6$), trifluoromethane (CHF$_3$), difluoromethane (CH$_2$F$_2$), and nitrogen fluoride (NF$_3$), and combinations thereof.

46. The method of claim 35 wherein the gas mixture of steps (b) and (d) further comprises an inert gas.

47. The method of claim 46 wherein the inert gas is selected from the group of helium (He), argon (Ar), neon (Ne), and combinations thereof.

48. The method of claim 35 wherein the ratio of the silicon source to the fluorine source in the gas mixture of steps (b) and (d) has a range of about 1:1 to about 1:100.

49. The method of claim 35 wherein the substrate is heated to a temperature between about 150° C. to about 450° C. during steps (b) and (d).

50. The method of claim 35 wherein steps (b) and (d) are performed at a pressure within a range of about 1 torr to about 15 torr.

51. The method of claim 35 wherein either of the silicon source or the carbon source of steps (b) and (d) is provided to the deposition chamber at a flow rate in a range of about 10 sccm to about 2,000 sccm.

52. The method of claim 35 wherein the fluorine source of steps (b) and (d) is provided to the deposition chamber at a flow rate in a range of about 50 sccm to about 10,000 sccm.

53. The method of claim 35 wherein the electric field is generated from one or more radio frequency (RF) powers.

54. The method of claim 53 wherein each of the one or more RF powers is in a range of about 1 watt/cm$^2$ to about 10 watts/cm$^2$.

55. The method of claim 35 wherein the fluorine-containing silicon carbide hard mask is an antireflective coating (ARC) to actinic radiation at wavelengths less than about 250 nm.

56. The method of claim 35, further comprising the step of plasma treating the fluorine-containing silicon carbide barrier layer and the fluorine-containing silicon carbide hard mask.

57. The method of claim 56 wherein either of the fluorine-containing silicon carbide barrier layer and the fluorine-containing silicon carbide hard mask are plasma treated by:

providing one or more inert gas to a process chamber having the substrate therein with either of the fluorine-containing silicon carbide barrier layer or the fluorine-containing silicon carbide hard mask formed thereon; and applying an electric field to the one or more inert gas to generate a plasma in the process chamber.

58. The method of claim 57 wherein the one or more inert gas is selected from the group of helium (He), argon (Ar), neon (Ne), and combinations thereof.

59. The method of claim 57 wherein the process chamber is maintained at a pressure in a range of about 5 torr to about 10 torr.

60. The method of claim 57 wherein the one or more inert gas is provided to the process chamber at a flow rate in a range of about 1,000 sccm to about 7,000 sccm.

61. The method of claim 57 wherein the electric field is a radio frequency (RF) power.

62. The method of claim 61 wherein the RF power is within a range of about 1 watt/cm$^2$ to about 10 watts/cm$^2$.

63. A method of forming a device, comprising:
 (a) forming a fluorine-containing silicon nitride layer on a substrate in a deposition chamber, wherein the fluorine-containing silicon nitride layer is formed by reacting a gas mixture comprising a silicon source, a nitrogen source, and a fluorine source in the presence of an electric field; and
 (b) defining a pattern in at least one region of the fluorine-containing silicon nitride layer.

64. The method of claim 63, further comprising transferring the pattern defined in the at least one region of the fluorine-containing silicon nitride layer into the substrate using the fluorine-containing silicon nitride layer as a mask.

65. The method of claim 63 wherein the fluorine-containing silicon nitride layer is an anti-reflective coating (ARC) to actinic radiation at wavelengths less than about 250 nm (nanometers).

66. A method of fabricating a metal interconnect structure, comprising
 (a) providing a substrate having a metal layer thereon;
 (b) forming a fluorine-containing silicon nitride barrier layer on the metal layer, wherein the fluorine-containing silicon nitride barrier layer is formed by reacting a gas mixture comprising a silicon source, a nitrogen source, and a fluorine source in the presence of an electric field;
 (c) forming a first dielectric layer on the fluorine-containing silicon nitride barrier layer;
 (d) forming a fluorine-containing silicon nitride hard mask on the first dielectric layer, wherein the fluorine-containing silicon carbide hard mask is formed by reacting silicon source, a nitrogen source, and a fluorine source in the presence of an electric field;
 (e) patterning the fluorine-containing silicon nitride hard mask to define vias therethrough;
 (f) forming a second dielectric layer on the patterned fluorine-containing silicon nitride hard mask;
 (g) patterning the second dielectric layer to define interconnects therethrough, wherein the interconnects are positioned over the vias defined in the fluorine-containing silicon nitride hard mask;
 (h) transferring the via pattern through the first dielectric layer using the fluorine-containing silicon nitride hard mask as a mask;
 (i) forming the vias through the fluorine-containing silicon nitride barrier layer; and
 (j) filling the vias and interconnects with a conductive material.

67. A method of fabricating a metal interconnect structure, comprising:
 (a) providing a substrate having a metal layer thereon;
 (b) forming a barrier layer on the metal layer;
 (c) forming a first fluorine-containing organosilicate layer on the barrier layer wherein the first fluorine-containing organosilicate layer is formed by reacting a gas mixture comprising a silicon source, a carbon source, an oxygen source, and a fluorine source in the presence of an electric field;
 (d) forming a hard mask on the first fluorine-containing organosilicate layer;
 (e) patterning the hard mask to define vias therethrough;

(f) forming a second fluorine-containing organosilicate layer on the patterned hard mask, wherein the second fluorine-containing organosilicate layer is formed by reacting a silicon source, a carbon source, an oxygen source, and a fluorine source in the presence of an electric field;

(g) patterning the second fluorine-containing organosilicate layer to define interconnects therethrough, wherein the interconnects are positioned over the vias defined in the hard mask;

(h) transferring the via pattern through the first fluorine-containing organosilicate layer using the hard mask as a mask;

(i) forming the vias through the barrier layer; and (j) filling the vias and interconnects with a conductive material.

* * * * *

UNITED STATES PATENT AND TRADEMARK OFFICE
CERTIFICATE OF CORRECTION

PATENT NO. : 6,777,171 B2 Page 1 of 1
APPLICATION NO. : 09/839869
DATED : August 17, 2004
INVENTOR(S) : Ping Xu et al.

It is certified that error appears in the above-identified patent and that said Letters Patent is hereby corrected as shown below:

<u>In the Specification</u>

Column 5, Line 17:   Change "filed" to --field--

<u>In the Claims</u>

Column 22, Claim 42, Line 61:   Change "$Si_xC_yH_x$" to --$Si_xC_yH_z$--

Column 26, Claim 67, Line 6: Change "(i)" to --(j)--

Signed and Sealed this

Twenty-ninth Day of August, 2006

JON W. DUDAS
*Director of the United States Patent and Trademark Office*